(12) United States Patent
Kumon et al.

(10) Patent No.: US 9,053,924 B2
(45) Date of Patent: Jun. 9, 2015

(54) CLEANING AGENT FOR SILICON WAFER

(75) Inventors: Soichi Kumon, Matsusaka (JP); Takashi Saio, Suzuka (JP); Shinobu Arata, Matsusaka (JP); Hidehisa Nanai, Tokyo (JP); Yoshinori Akamatsu, Matsusaka (JP); Shigeo Hamaguchi, Matsusaka (JP); Kazuhiko Maeda, Tokyo (JP)

(73) Assignee: Central Glass Company, Limited, Ube-shi (JP)

( * ) Notice: Subject to any disclaimer, the term of this patent is extended or adjusted under 35 U.S.C. 154(b) by 645 days.

(21) Appl. No.: 12/898,185

(22) Filed: Oct. 5, 2010

(65) Prior Publication Data

US 2011/0214685 A1   Sep. 8, 2011

Related U.S. Application Data

(63) Continuation-in-part of application No. PCT/JP2010/057008, filed on Apr. 20, 2010, and a continuation-in-part of application No. PCT/JP2009/071413, filed on Dec. 24, 2009.

(30) Foreign Application Priority Data

Dec. 26, 2008  (JP) ................................. 2008-334478
Apr. 24, 2009  (JP) ................................. 2009-106894
Apr. 16, 2010  (JP) ................................. 2010-094696

(51) Int. Cl.
   *H01L 21/02*   (2006.01)
   *B08B 3/00*    (2006.01)
   (Continued)

(52) U.S. Cl.
   CPC ........ *H01L 21/02052* (2013.01); *C09D 183/04* (2013.01); *B08B 3/00* (2013.01); *C11D 3/162* (2013.01); *C11D 7/5022* (2013.01); *H01L 21/00* (2013.01); *H01L 21/02054* (2013.01)

(58) Field of Classification Search
   CPC .............................. C11D 3/162; C09D 183/04
   See application file for complete search history.

(56) References Cited

U.S. PATENT DOCUMENTS 5,326,672 A   7/1994   Tanaka et al.
5,374,502 A   12/1994  Tanaka et al.
(Continued)

FOREIGN PATENT DOCUMENTS

JP   5-299336 A      11/1993
JP   2008-198958 A   8/2008
(Continued)

OTHER PUBLICATIONS

International Search Report with English translation and PCT/ISA/237 dated Mar. 16, 2010 (Six (6) pages).
(Continued)

*Primary Examiner* — Gregory Webb
(74) *Attorney, Agent, or Firm* — Crowell & Moring LLP

(57) ABSTRACT

A cleaning agent for a silicon wafer (a first cleaning agent) contains at least a water-based cleaning liquid and a water-repellent cleaning liquid for providing at least a recessed portion of an uneven pattern with water repellency during a cleaning process. The water-based cleaning liquid is a liquid in which a water-repellent compound having a reactive moiety chemically bondable to Si element in the silicon wafer and a hydrophobic group, and an organic solvent including at least an alcoholic solvent are mixed and contained. With this cleaning agent, the cleaning process which tends to induce a pattern collapse can be improved.

6 Claims, 2 Drawing Sheets

(51) Int. Cl.
  *C11D 3/16* (2006.01)
  *C11D 7/50* (2006.01)
  *H01L 21/00* (2006.01)
  *C09D 183/04* (2006.01)

(56) References Cited

U.S. PATENT DOCUMENTS

| | | | |
|---|---|---|---|
| 6,312,759 B1* | 11/2001 | Yamada et al. | 427/131 |
| 7,749,909 B2 | 7/2010 | Tomita et al. | |
| 7,838,425 B2* | 11/2010 | Tomita et al. | 438/690 |
| 8,037,890 B2* | 10/2011 | Yamamoto et al. | 134/94.1 |
| 8,216,636 B2* | 7/2012 | Chan et al. | 427/122 |
| 2004/0013858 A1* | 1/2004 | Hacker et al. | 428/195.1 |
| 2004/0018452 A1* | 1/2004 | Schilling | 430/314 |
| 2006/0078827 A1* | 4/2006 | Hacker et al. | 430/311 |
| 2007/0287277 A1* | 12/2007 | Kolics et al. | 438/597 |
| 2008/0241489 A1 | 10/2008 | Ishibashi et al. | |
| 2009/0072190 A1* | 3/2009 | Kolics | 252/79.1 |
| 2009/0311874 A1 | 12/2009 | Tomita et al. | |
| 2010/0075504 A1 | 3/2010 | Tomita et al. | |
| 2010/0122711 A1* | 5/2010 | Ryan | 134/2 |

FOREIGN PATENT DOCUMENTS

| | | |
|---|---|---|
| JP | 2008-277748 A | 11/2008 |
| JP | 2008-547050 A | 12/2008 |
| WO | WO 2010/047196 A1 | 4/2010 |

OTHER PUBLICATIONS

International Search Report with partial English translation and PCT/ISA/237 dated Jun. 29, 2010 (Six (6) pages).
Japanese Industrial Standard JIS R 3257, Testing method of wettability of glass substrate, 1999 (sixteen (16) pages).
Japanese Industrial Standard Handbook, Machine Elements, 2003 (sixteen (16) pages).
Taiwanese Office Action dated Dec. 6, 2012 (six (6) pages).
Taiwanese Office Action dated Dec. 6, 2012 (three (3) pages).
Korean Office Action dated Dec. 6, 2012 (four (4) pages).

* cited by examiner

CLEANING AGENT FOR SILICON WAFER

TECHNICAL FIELD

The present invention relates to a technique of cleaning a silicon substrate (a wafer) in production of semiconductor devices, the purpose of which being production yield improvements of devices having such a circuit pattern as to be particularly fine and particularly high in aspect ratio.

BACKGROUND OF THE INVENTION

Semiconductor devices for use in networks or digital household electric appliances are being further desired to be sophisticated, multifunctional, and low in power consumption. Accordingly, the trend toward micro-patterning for circuits has been developed, with which micro-sizing of particles has advanced to cause reduction in production yield. As a result of this, a cleaning process for the purpose of removing the micro-sized particles is frequently used. As a result of this, 30-40% of the whole of the semiconductor fabrication process is occupied with the cleaning process.

On the other hand, in cleaning conventionally performed with a mixed ammonia cleaning agent, damages to the wafer due to its basicity are getting serious with the trend toward micro-patterning for circuits. Therefore, alternation with a dilute hydrofluoric acid-based cleaning agent is taking place.

With this, problems about the damages to the wafer due to cleaning have been solved; however, problems due to an aspect ratio increased with the trend toward micro-processing in the semiconductor devices have become obvious. In other words, a phenomenon where the pattern collapses when a gas-liquid interface passes through the pattern is brought about after cleaning or rinsing to largely reduce the yield, which has become a significant problem.

The pattern collapse occurs at the time of drawing the wafer out of a cleaning liquid or a rinsing liquid. It is said that the reason thereof is that a difference in height of residual liquid between a part of high aspect ratio and a part of low aspect ratio causes a difference in capillary force which acts on the pattern.

Accordingly, it is expected, by decreasing the capillary force, that the difference in capillary force due to the difference in height of residual liquid is reduced thereby resolving the pattern collapse. The magnitude of the capillary force is the absolute value of P obtained by the equation as represented below. It is expected from this equation that the capillary force can be reduced if decreasing $\gamma$ or $\cos \theta$.

$$P = 2 \times \gamma \times \cos \theta / S \text{ ($\gamma$: Surface tension, $\theta$: Contact angle, S: Pattern width).}$$

In Patent Document 1, a technique of replacing water serving as a cleaning agent with 2-propanol before the gas-liquid interface passes through the pattern is disclosed as a method of decreasing $\gamma$ to suppress the pattern collapse. This method is effective for preventing the pattern collapse; however, a solvent having small $\gamma$ such as 2-propanol and the like is also small in normal contact angle, which results in the trend to increase $\cos \theta$. It is therefore said that there are limitations to adaptable patterns, for example, an aspect ratio of not higher than 5.

Additionally, in Patent Document 2, a technique directed to a resist pattern is disclosed as a method for decreasing $\cos \theta$ to suppress the pattern collapse. This method is a method of setting a contact angle to around 90° to bring $\cos \theta$ close to 0 so as to reduce the capillary force to the limit thereby suppressing the pattern collapse.

However, the thus disclosed technique cannot be applied to the present object, because: it is directed to the resist pattern or for reforming a resist itself; and a final removal together with the resist is possible so as not to need the assumption about a method of removing a treatment agent after drying.

Additionally, the use of a critical fluid, the use of liquid nitrogen or the like are proposed as the method of preventing the pattern collapse of the semiconductor devices. However, any of these needs a treatment in a closed system or a batch in contrast to the conventional cleaning processes and therefore involves issues in view of cost such as throughput, though effective to some extent.

REFERENCES ABOUT PRIOR ART

Patent Publication

Patent Publication 1: Japanese Patent Application Publication No. 2008-198958
Patent Publication 2: Japanese Patent Application Publication No. 5-299336

SUMMARY OF THE INVENTION

In production of semiconductor devices, a surface of a silicon wafer is made a surface having a finely uneven pattern. An object of the present invention is to provide a silicon wafer cleaning agent for improving a cleaning process which tends to induce a pattern collapse, in a method of producing the silicon wafer having at its surface a finely uneven pattern.

A cleaning agent for a silicon wafer having a finely uneven pattern at its surface (a first cleaning agent), according to the present invention, comprises: a water-based cleaning liquid; and a water-repellent cleaning liquid for providing at least a recessed portion of the uneven pattern with water repellency during a cleaning process. The water-repellant cleaning liquid comprises a mixture of a water-repellant compound and an organic solvent. The water-repellant compound has a hydrophobic group and a reactive moiety chemically bondable to Si element in the silicon wafer. The organic solvent contains at least an alcoholic solvent.

A cleaning agent for a silicon wafer having at its surface a finely uneven pattern (a second cleaning agent), according to the present invention comprises: a cleaning liquid A comprising a water-based solution; and a cleaning liquid B for providing a recessed portion of the uneven pattern with water repellency.

In this cleaning agent, the cleaning liquid B comprises a water-repellent compound, an alcoholic solution, and one of water and an acidic aqueous solution. The water-repellent compound has a hydrophobic group and a hydrolyzable moiety which can form a unit chemically bondable to Si element in the silicon wafer. The alcoholic solution contains an alcohol solvent. Additionally, the water-repellent compound is mixed into the cleaning liquid B in an amount of from 0.2 to 20 mass % relative to the total quantity of 100 mass % of the cleaning liquid B thereby being able to exhibit a capillary force of not larger than 2.1 $MN/m^2$ on the assumption that water is retained in the recessed portion of the surface of the silicon wafer which surface is provided with water repellency by the cleaning liquid B.

In the cleaning agent of the present invention, each cleaning liquid is mutually independently used, and at least two or more kinds of the cleaning liquids are used.

Additionally, in the present invention, water repellency means to decrease a surface energy of a surface of an article thereby reducing an interaction between water or other liquid and the surface of the article (an interface), such as hydrogen bond, intermolecular forces and the like. The effect of reducing an interaction against water is particularly exhibited; however, the effect of reducing an interaction against a mixture liquid of water and liquid other than water or against a liquid other than water is also exhibited. With the reduction of the interaction, it is possible to increase a contact angle of the liquid to the surface of the article.

In cleaning the silicon wafer in which an uneven pattern is formed, the water-based cleaning liquid contained in the silicon wafer cleaning agent of the present invention (the first cleaning agent) is provided to recessed portions of the surface of the silicon wafer upon making the surface of the silicon wafer a surface having a finely uneven pattern. Additionally, the water-based cleaning liquid may be provided to the silicon wafer through providing the water-repellent cleaning liquid to the silicon wafer. Furthermore, the water-repellent cleaning liquid and the water-based cleaning liquid may be provided to the surface of the silicon wafer while substituting a cleaning liquid different from the cleaning liquids under a condition where the different cleaning liquid is retained in the recessed portions of the surface of the silicon wafer.

In cleaning the silicon wafer in which an uneven pattern is formed, in the cleaning agent for the silicon wafer having at its surface a finely uneven pattern (the second cleaning agent), the cleaning liquid B is provided to the silicon wafer upon providing the cleaning liquid A to the silicon wafer. Furthermore, the cleaning liquid B may be provided to the surface of the silicon wafer while substituting a cleaning liquid different from the cleaning liquid under a condition where the different cleaning liquid is retained in the recessed portion of the surface of the silicon wafer.

The cleaning agent for the silicon wafer of the present invention is comprised of two or more cleaning liquids and is used while substituting a cleaning liquid retained in the recessed portion with another cleaning liquid. The cleaning agent is finally removed from the surface of the silicon wafer.

While the surface of the silicon wafer is cleaned by the cleaning agent for the silicon wafer of the present invention, the recessed portion of the surface of the silicon wafer is to temporarily retain the water-repellent cleaning liquid (the cleaning liquid B). With this retention, the recessed portion is brought into a surface condition provided with water repellency by the water-repellent compound. The surface condition provided with water repellency of the present invention may not be necessarily continuously established and may not be necessarily uniformly established; however, it is preferable to establish it continuously and uniformly since more excellent water repellency is obtained thereby.

In the present invention, the water-repellent compound has a reactive moiety chemically bondable to Si element in the silicon wafer, and a hydrophobic group. With this, the surface of the silicon wafer can keep the surface condition provided with water repellency until the cleaning agent is removed from the recessed portion. Since the surface of the recessed portion is under the condition provided with water repellency when the cleaning liquid is removed or dried, the capillary force is so reduced that the pattern collapse becomes hard to occur. If the capillary force of the surface of the recessed portion on the assumption that water is retained in the recessed portion of the surface of the silicon wafer provided with water repellency is not larger than 2.1 MN/m$^2$, the capillary force is so small as not to cause the pattern collapse and therefore preferable. Additionally, the surface condition provided with water repellency can be removed by at least one treatment selected from irradiation with light, heating of the silicon wafer, and exposing the silicon wafer to ozone.

Additionally, in the water-repellent cleaning liquid in the first cleaning agent, the water-repellent compound having a reactive moiety chemically bondable to Si element in the silicon wafer and a hydrophobic group and the alcoholic solvent are mixed and contained. With this, the surface of the recessed portion can readily reach the surface condition sufficiently provided with water repellency, in a short time.

In the water-repellent cleaning liquid, a water-repellent compound of less than 0.1 mass % relative to the total quantity of 100 mass % of the water-repellent cleaning liquid makes the surface of the recessed portion hard to reach the surface condition sufficiently provided with water repellency. Meanwhile, a water-repellent compound exceeding 99.9 mass % lessens the effect of alcohol (with which water repellency can be sufficiently imparted to the surface of the recessed portion in a short time).

In the cleaning liquid B in the second cleaning agent, a water-repellent compound of less than 0.2 mass % makes the surface of the recessed portion hard to reach the surface condition sufficiently provided with water repellency. Meanwhile, a water-repellent compound exceeding 20 mass % accelerates coagulation of the water-repellent compound so as to make the surface of the recessed portion hard to reach the surface condition uniformly provided with water repellency. As a result of this, in a process of irradiating the surface of the silicon wafer with light or a process of heating the silicon wafer, it becomes necessary to spare an additional time for light irradiation or heating in order to remove a region formed due to the coagulation of the water-repellent compound.

DETAILED DESCRIPTION

Figure 1:
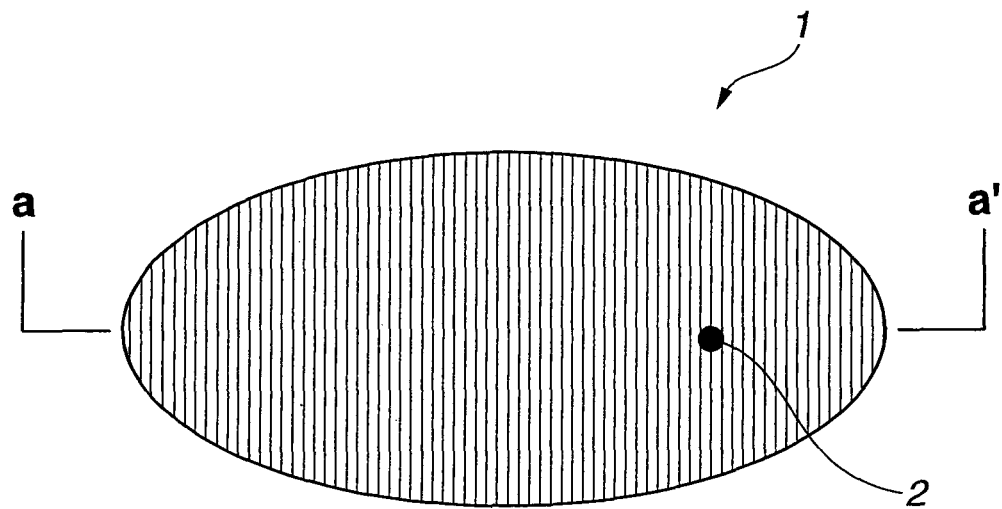
[FIG. 1] A schematic plan view of a silicon wafer 1 of which surface is made a surface having a finely uneven pattern 2.

A silicon wafer cleaning agent of the present invention exhibits an excellent pattern collapse-preventability. When using the cleaning agent, therefore, a cleaning process in a production method for a silicon wafer having a finely uneven pattern at its surface is improved without reducing throughput. With this, the productivity of the production method for the silicon wafer having the finely uneven pattern at its surface, which is conducted by using the silicon wafer cleaning agent of the present invention, is increased.

The silicon wafer cleaning agent of the present invention is adaptable to uneven patterns having aspect ratios expected to be raised increasingly, for example, an aspect ratio of not less than 7, and therefore allows cost reduction in producing more sophisticated semiconductor devices. In addition to this, the agent is adaptable without considerably modifying conventional apparatuses, which results in being one appliable in production of various kinds of semiconductor devices.

A cleaning method for a silicon wafer having a finely uneven pattern at its surface, using the silicon wafer cleaning agent of the present invention, preferably includes:

a step of making a surface of a silicon wafer a surface having a finely uneven pattern, followed by providing a water-based cleaning liquid (a cleaning liquid A) to the surface and retaining the water-based cleaning liquid (the cleaning liquid A) in recessed portions;

a step of substituting the water-based cleaning liquid (the cleaning liquid A) retained in the recessed portions with a cleaning liquid "a" which is different from the water-based cleaning liquid;

a step of retaining a water-repellent cleaning liquid (a cleaning liquid B) in the recessed portions in order to impart water repellency to surfaces of the recessed portions of the uneven pattern; and a step of removing the cleaning agent.

Furthermore, after the step of retaining the water-repellent cleaning liquid (the cleaning liquid B) in the recessed portions, the water-repellent cleaning liquid (the cleaning liquid B) retained in the recessed portions may be substituted with a cleaning liquid "b" which is different from the water-repellent cleaning liquid. Additionally, it is more preferable to take a step of retaining a water-based cleaning liquid comprised of a water-based solution in the recessed portions through the substitution with the different cleaning liquid "b".

Additionally, the step of removing the cleaning agent includes:

a step of drying thereby removing the cleaning liquid retained in the recessed portions from the recessed portions; and a step of conducting at least one treatment selected from irradiating the surface of the silicon wafer with light, heating the silicon wafer, and exposing the silicon wafer to ozone.

Additionally, in the step of removing the cleaning agent, between the step of drying thereby removing the cleaning liquid retained in the recessed portions from the recessed portions and the step of conducting at least one treatment selected from irradiating the surface of the silicon wafer with light, heating the silicon wafer, and exposing the silicon wafer to ozone, there may be taken: a step of providing the cleaning liquid "b" to the recessed portions and then removing the cleaning liquid "b" by drying; or a step of retaining the water-based cleaning liquid comprised of the water-based solution in the recessed portions after providing the cleaning liquid "b", followed by removing the water-based cleaning liquid by drying.

The water-repellent cleaning liquid in the first cleaning agent is a liquid in which the water-repellent compound having a reactive moiety chemically bondable to Si element in the silicon wafer and an organic solvent containing at least an alcoholic solvent are mixed and contained, the water-repellent compound being from 0.1 to 99.9 mass %, preferably from 0.2 to 75 mass %, much more preferably 0.3 to 50 mass % relative to the total quantity of 100 mass % of the water-repellent cleaning liquid. With a 0.1 to 99.9 mass % content of the water-repellent compound, the surfaces of the recessed portions can readily obtain the surface condition uniformly provided with water repellency, in a short time.

The water-repellent cleaning liquid contains at least an alcoholic solvent. With the presence of the alcoholic solvent, a reaction between the water-repellent compound and Si element in the silicon wafer is accelerated, so that the surfaces of the recessed portions can readily obtain the surface condition sufficiently provided with water repellency, in a short time.

Examples of the alcoholic solvent are: alcohol comprised of alkyl group and one hydroxyl group, such as methanol, ethanol, 1-propanol, 2-propanol, 1-butanol, 2-butanol, tert-butanol, iso-butanol, 1-pentanol, 1-hexanol, 1-heptanol, 1-octanol and the like; and polyhydric alcohol and derivatives of these, such as ethylene glycol, glycerine, 1,2-propanediol, 1,3-propanediol, 1,2-butanediol, 1,3-butanediol, diethylene glycol monoethyl ether, ethylene glycol monomethyl ether, ethylene glycol monoethyl ether, ethylene glycol monobutyl ether, propylene glycol monomethyl ether, propylene glycol monoethyl ether and the like.

Additionally, the alcoholic solvent is preferably an alcohol comprised of alkyl group and one hydroxyl group. In this case, the surfaces of the recessed portions can readily obtain the surface condition sufficiently provided with water repellency, in a short time. Furthermore, among alcohols comprised of alkyl group and one hydroxyl group, primary alcohol and secondary alcohol are particularly preferable.

Additionally, the alcoholic solvent preferably has a carbon number of not larger than 10, particularly preferably has a carbon number of not larger than 6. Furthermore, the alcoholic solvent may be either a single one or a mixture of two or more alcoholic solvents.

It is preferable to set the alcoholic solvent from 0.1 to 10000 mass %, particularly from 0.5 to 5000 mass % relative to the total quantity of 100 mass % of the water-repellent compound because the surfaces of the recessed portions can readily obtain the surface condition sufficiently provided with water repellency in a short time.

Additionally, the water-repellent cleaning liquid may contain other organic solvents than the alcoholic solvent. Since the water-repellent compound is reactive with protic solvents, it is particularly preferable to use an aprotic solvent as the organic solvents other than the alcoholic solvent because water repellency can be readily exhibited in a short time. Incidentally, the aprotic solvent includes both aprotic polar solvents and aprotic nonpolar solvents. Examples of such an aprotic solvent are hydrocarbons, esters, ethers, ketones, halogen-element-containing solvents, sulfoxide-based solvents, derivatives of polyhydric alcohol having no hydroxyl group, and nitrogen element-containing solvents having no N—H bond. Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen-element-containing solvent are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of the derivatives of polyhydric alcohol having no hydroxyl group are diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethylmethyl ether, ethylene glycol diethyl ether, ethylene glycol dimethyl ether and the like. Examples of the nitrogen element-containing solvents having no N—H bond are N,N-dimethylformamide, N,N-dimethylacetamide, N-methyl-2-pyrrolidone, triethylamine, pyridine and the like.

Additionally, it is preferable to use an uninflammable one as the organic solvent other than the alcoholic solvent since the water-repellent cleaning liquid becomes uninflammable or increases in flash point to reduce the risk of the water-repellent cleaning liquid. Most of the halogen-element-containing solvents are uninflammable. Such a halogen-element-containing uninflammable solvent can be preferably used as an uninflammable organic solvent.

In this case, the organic solvent other than the alcoholic solvent is preferably from 2 to 95000 times, more preferably from 4 to 50000 times the alcoholic solvent, in mass ratio.

In a case of providing the water-repellent cleaning liquid to the wafer while rotating the wafer and in a case where the organic solvent has a low boiling point, the water-repellent cleaning liquid tends to dry up before so spreading over the wafer as to wet the same. Additionally, in a case where the boiling point is high, the viscosity tends to increase. Therefore, it is preferable to use an organic solvent having a boiling point of from 70 to 220° C. When taking the cost or compatibility with other cleaning liquids (a facility for substitution) into account, 1-propanol and 2-propanol are preferable as an alcohol, diethylene glycol monoethyl ether acetate, ethylene glycol monomethyl ether acetate, propylene glycol monomethyl ether acetate, propylene glycol monoethyl ether acetate, diethylene glycol dimethyl ether, diethylene glycol ethylmethyl ether, ethylene glycol diethyl ether, ethylene glycol dimethyl ether and cyclohexanone are preferable as the organic solvent other than the alcoholic solvent.

The cleaning liquid B is a liquid in which a water-repellent compound having a hydrolyzable moiety and a hydrophobic group, an alcoholic solution containing an alcohol solvent, and water or a acidic aqueous solution are mixed. It is preferable to mix the water-repellent compound in an amount of 0.2 to 20 mass %, preferably in an amount of 0.5 to 10 mass %.

In a pattern forming step in which the surface of the silicon wafer is made a surface having a finely uneven pattern, a resist is applied to the surface of the wafer first of all. Thereafter, the resist is exposed through a resist mask, followed by conducting an etching removal on the exposed resist or an unexposed resist, thereby producing a resist having a desired uneven pattern. Additionally, the resist having the uneven pattern can be obtained also by pushing a mold having a pattern onto a resist. Then, etching is conducted on the wafer. At this time, recessed portions of a resist pattern are etched selectively. Finally, the resist is stripped off thereby obtaining a silicon wafer having a finely uneven pattern.

Incidentally, the silicon wafer also includes those on which surface a silicon oxide film such as native oxide film, a thermal oxide film, a gas-phase synthesized film (a CVD film, etc.) and the like is formed or those in which at least a part of its uneven pattern is to be silicon oxide when forming the uneven pattern. Additionally, silicon and silicon nitride are also usable because these are naturally oxidized to form a silicon oxide film on its surface when an outermost surface of them is brought into contact with water or air.

Additionally, also against a wafer comprised of two or more components including silicon and/or silicon oxide, it is possible to provide its surface of silicon and/or silicon oxide with water repellency. The wafer comprised of two or more components includes those on which surface a silicon film and/or a silicon oxide film such as a native oxide film, a thermal oxide film, a gas-phase synthesized film (a CVD film, etc.) and the like is formed or those in which at least a part of its uneven pattern is to be silicon and/or silicon oxide when forming the uneven pattern.

Figure 2:
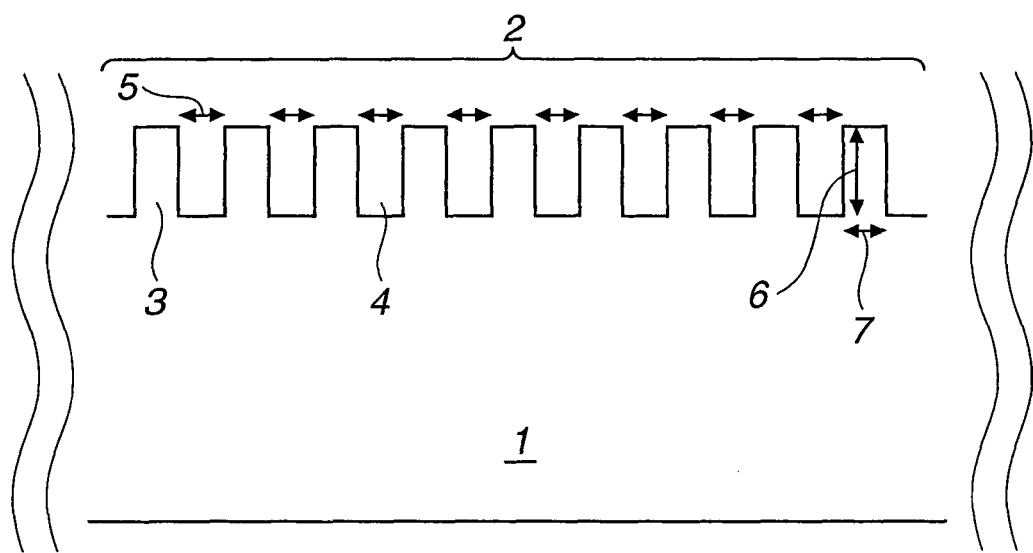
[FIG. 2] A view showing a part of a-a' cross section of FIG. 1.

After making the surface of the silicon wafer a surface having a finely uneven pattern, cleaning of the surface is conducted in the use of the water-based cleaning liquid (the cleaning liquid A), followed by removing the water-based cleaning liquid by drying or the like. If the recessed portions have a small width and projected portions have a large aspect ratio, a pattern collapse is to easily occur. The uneven pattern is defined as shown in FIG. 1 and FIG. 2. FIG. 1 is a schematic plan view of a silicon wafer 1 whose surface is made a surface having a finely uneven pattern. FIG. 2 shows a part of an a-a' cross section in FIG. 1. A width 5 of recessed portions is defined by an interval between a projected portion 3 and a projected portion 3, as shown in FIG. 2. The aspect ratio of projected portions is expressed by dividing a height 6 of the projected portions by a width 7 of the recessed portions. The pattern collapse in the cleaning process is to easily occur when the recessed portions have a width of not more than 70 nm, particularly not more than 45 nm and when the aspect ratio is not less than 4, particularly not less than 6.

In the preferable embodiment of the present invention, when the first cleaning agent is used the surface of the silicon wafer is made a surface having a finely uneven pattern, followed by providing the water-based cleaning liquid to the surface to retain the water-based cleaning liquid in the recessed portions. Then, the water-based cleaning liquid retained in the recessed portions is substituted with the cleaning liquid a which is different from the water-based cleaning liquid. Preferable examples of the different cleaning liquid "a" are the water-repellent cleaning liquid specified by the present invention, water, organic solvents, a mixture of these, these to which at least one kind of acid, alkali and surfactants is added, and the like. Particularly, if taking damages and cleanliness of the pattern into account, the particularly preferable are the water-repellent cleaning liquid specified by the present invention, water, organic solvents and a mixture of these. Additionally, in the case of using other than the water-repellent cleaning liquid as the different cleaning liquid "a", it is preferable to substitute the different cleaning liquid "a" with the water-repellent cleaning liquid under a condition where the different cleaning liquid "a" is retained in the recessed portions 4.

Additionally, examples of the organic solvents, which is one of the preferable examples of the different cleaning liquid "a", include hydrocarbons, esters, ethers, ketones, halogen-element-containing solvents, sulfoxide-based solvents, alcohols, derivatives of polyhydric alcohol, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen-element-containing solvent are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of the alcohols are methanol, ethanol, propanol, butanol, ethylene glycol, 1,3-propanediol and the like. Examples of the derivatives of polyhydric alcohol are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethylmethyl ether, ethylene glycol diethyl ether, ethylene glycol dimethyl ether and the like. Examples of the nitrogen element-containing solvents are formamide, N,N-dimethylformamide, N,N-dimethylacetamide, N-methyl-2-pyrrolidone, diethylamine, triethylamine, pyridine and the like.

Figure 3:
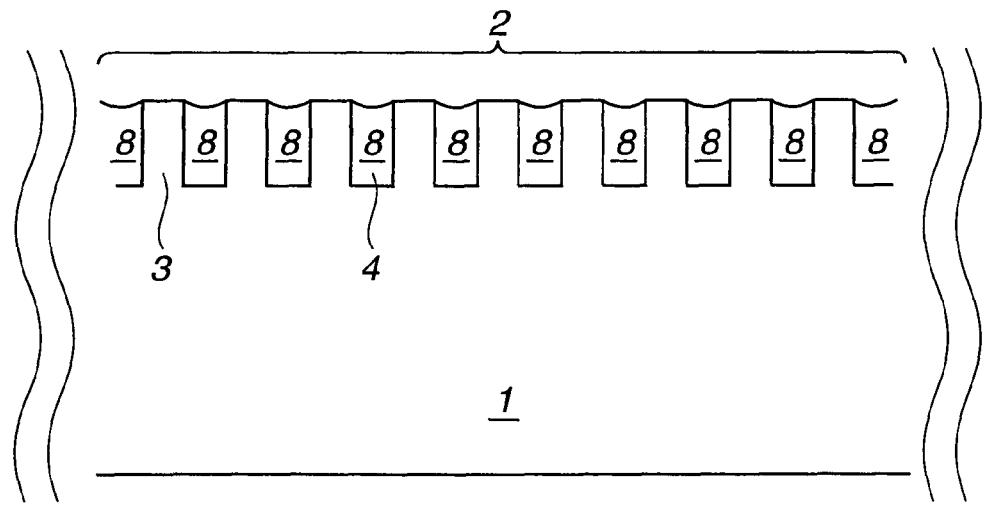
[FIG. 3] A schematic view showing a condition where a cleaning liquid 8 is retained in a recessed portion 4 in a cleaning process.

FIG. 3 is a schematic view showing a condition where a cleaning liquid 8 is retained in the recessed portions 4 in the cleaning process. A silicon wafer of the schematic view of FIG. 3 shows a part of the a-a' cross section in FIG. 1. At the time of the cleaning process, the water-repellent cleaning liquid is provided onto a silicon wafer 1 in which an uneven pattern 2 is formed. At this time, the water-repellent cleaning liquid is brought into a condition retained at least in the recessed portions 4 as shown in FIG. 3, thereby imparting water repellency to the recessed portions 4.

When the second cleaning agent is used in the cleaning process, first of all, the cleaning liquid A comprised of the water-based solution is provided to the silicon wafer 1 in which the uneven pattern 2 is formed. At this time, the cleaning liquid A is brought into the condition retained at least in the recessed portions 4, as shown in FIG. 3. Then, the cleaning liquid A retained in the recessed portions 4 is substituted with the different cleaning liquid "a". Examples of the different cleaning liquid "a" are the cleaning liquid B, water, a water-soluble organic solvent, a mixture of these, a mixture of these to which at least one or more kinds of acid, alkali and surfactant is added, and the like. Incidentally, the water-soluble organic solvent is preferably one in which about 5 mass % of water relative to 100 mass % of the organic solvent can dissolve. Additionally, it may be a mixture solution of two or more organic solvents. Particularly in the case of using other than the cleaning liquid B as the different cleaning liquid, it is preferable to substitute the cleaning liquid with the cleaning liquid B while keeping the condition where the cleaning liquid other than the cleaning liquid B is retained in the recessed portions 4.

In a case of providing the water-based cleaning liquid through the substitution with the cleaning liquid different from the cleaning liquid and through a condition where the water-repellent cleaning liquid (the cleaning liquid B) is temporarily retained in the recessed portions 4, the water-repellent cleaning liquid (the cleaning liquid B) retained in the recessed portions 4 is substituted with the cleaning liquid "b" which is different from the water-repellent cleaning liquid (the cleaning liquid B). Examples of the different cleaning liquid "b" are: a water-based cleaning liquid comprised of a water-based solution; an organic solvent; a mixture of the water-based cleaning liquid and the organic solvent; these in which at least one kind of acid, alkali and surfactants are mixed; and the like. Particularly, if taking damages and cleanliness of the pattern into account, the water-based cleaning liquid, the organic solvent or the mixture of the water-based cleaning liquid and the organic solvent are preferable. Additionally, when using other than the water-based cleaning liquid as the different cleaning liquid "b", it is preferable to substitute the cleaning liquid with the water-based cleaning liquid under a condition where a cleaning liquid other than the water-based cleaning liquid is retained in the recessed portions 4.

Additionally, an example of the organic solvent, which is one preferable example of the different cleaning liquid "b", is hydrocarbons, esters, ethers, ketones, halogen-element-containing solvents, sulfoxide-based solvents, alcohols, derivatives of polyhydric alcohol, nitrogen element-containing solvents, and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen-element-containing solvent are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of the alcohols are methanol, ethanol, propanol, butanol, ethylene glycol, 1,3-propanediol and the like. Examples of the derivatives of polyhydric alcohol are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethylmethyl ether, ethylene glycol diethyl ether, ethylene glycol dimethyl ether and the like. Examples of the nitrogen element-containing solvents are formamide, N,N-dimethylformamide, N,N-dimethylacetamide, N-methyl-2-pyrrolidone, diethylamine, triethylamine, pyridine and the like.

Examples of the water-based cleaning liquid (the cleaning liquid A) are water or water obtained by mixing at least one kind of an organic solvent, acid and alkali, which include water as a primary component (for example, 50 mass % or more water content). If taking the cleanliness into account, it is particularly preferable to use water as the water-based cleaning liquid.

Figure 4:
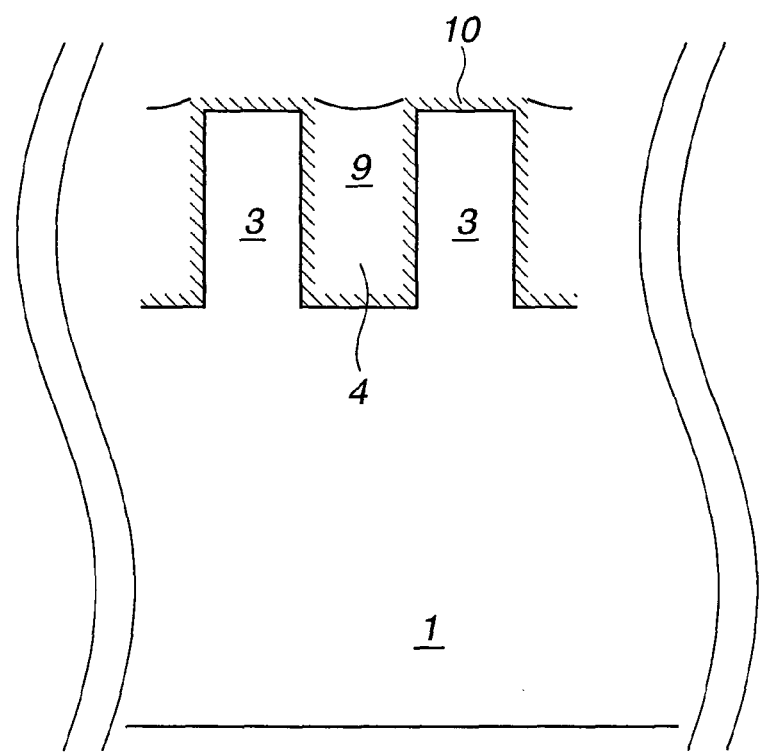
[FIG. 4] A schematic view showing a condition where a water-based cleaning liquid is retained in the recessed portion 4 which is under a surface condition provided with water repellency.

A schematic view of a case in which the water-based cleaning liquid is retained in the recessed portions 4 provided with water repellency by the water-repellent compound is shown in FIG. 4. A silicon wafer of the schematic view of FIG. 4 shows a part of the a-a' cross section in FIG. 1. The surfaces of the recessed portions 4 are brought into a surface condition 10 provided with water repellency by the water-repellent compound. Then, with a unit chemically bondable to Si element, the surface condition 10 provided with water repellency is kept on the surface of the silicon wafer even when the water-based cleaning liquid 9 is removed from the recessed portions 4.

When the recessed portions of the surface of the silicon wafer provided with water repellency by the water-repellent cleaning liquid (the cleaning liquid B) or the surfaces of the recessed portions 4 as shown in FIG. 4 are brought into the surface condition 10 provided with water repellency by the water-repellent compound, the capillary force on the assumption that water is retained in the recessed portions is preferably not greater than 2.1 MN/m². A capillary force of not greater than 2.1 MN/m² makes the pattern collapse difficult to occur, and therefore preferable. Additionally, a smaller capillary force makes the pattern collapse further difficult to occur, so that the capillary force is particularly preferably not greater than 1.5 MN/m², much more preferably not greater than 1.0 MN/m². Furthermore, it is ideal to put the capillary force close to 0.0 MN/m² as much as possible by adjusting the contact angle to the cleaning liquid to be around 90°.

Hereinafter, a description will be given about the first cleaning agent. In the water-repellent compound in the water-repellent cleaning liquid which compound has a reactive moiety chemically bondable to Si element in the silicon wafer and a hydrophobic group, the reactive moiety is exemplified by those who can react with silanol group (Si—OH group). Examples thereof are: halogen group such as chloro group, bromo group and the like; Si—N bond with isocyanate group, amino group, dialkylamino group, isothiocyanate group, azide group, acetamide group, silazane, —N(CH₃)COCH₃, —N(CH₃)COCF₃, imidazole ring, oxazolidinone ring, morpholine ring or the like; Si—O—C bond with alkoxy group, acetoxy group, trifluoroacetoxy group, —OC(CH₃)=CHCOCH₃, —OC(CH₃)=N—Si(CH₃)₃, —OC(CF₃)=N—Si(CH₃)₃, —CO—NH—Si(CH₃)₃ or the like; Si—O—S bond with alkylsulfonate group, perfluoroalkylsulfonate group or the like; nitrile group; and the like. Additionally, examples of the hydrophobic group are a monovalent organic group having hydrocarbon group and a monovalent organic group having C—F bond. Such a water-repellent compound is to swiftly react at its reactive moiety with silanol group of a silicon oxide layer of the uneven pattern of the silicon wafer so as to be chemically bonded to Si element in the silicon wafer through siloxane bond. With this, it becomes possible to coat the surface of the wafer with hydrophobic groups, thereby allowing reducing the capillary force of the surfaces of the recessed portions of the wafer in a short time.

Furthermore, it is preferable in the water-repellent cleaning liquid that the water-repellent compound having the reactive moiety chemically bondable to Si element in the silicon wafer and the hydrophobic group is comprised of at least one selected from the group consisting of the following general formulas [1] and [2].

$(R^1)_a Si(CH_3)_b H_c X_{4-a-b-c}$ [1]

$[R^2 Si(CH_3)_{2-d} H_d]_e NH_{3-e}$ [2]

Here, $R^1$ mutually independently is a monovalent organic group having hydrocarbon group with a carbon number of from 1 to 18 or a monovalent organic group having fluoroalkyl chain with a carbon number of from 1 to 8. $R^2$ mutually independently is a monovalent organic group having hydrocarbon group with a carbon number of from 1 to 18 or a monovalent organic group having fluoroalkyl chain with a carbon number of from 1 to 8. Additionally, X mutually independently represents at least one group selected from the group consisting of halogen group, alkoxy group, acetoxy group, trifluoroacetoxy group, —OC(CH₃)=CHCOCH₃, C(CH₃)=N—Si(CH₃)₃, —OC(CF₃)=N—Si(CH₃)₃, —CO—NH—Si(CH₃)₃, alkylsulfonate group, perfluoroalkylsulfonate group, nitrile group and a monovalent organic group whose element to be bonded to Si element is nitrogen. a is an integer of from 1 to 3. Each of b and c is an integer of from 0 to 2. The total of a, b and c is from 1 to 3. Furthermore, d is an integer of from 0 to 2. e is an integer of from 1 to 3.

Additionally, it is particularly preferable that each of $R^1$ of the general formula [1] and $R^2$ of the general formula [2] is $C_m H_{2m+1}$ (m=1-18) or $C_n F_{2n+1} CH_2 CH_2$ (n=1-8).

Examples of a usable water-repellent compound represented by the general formula [1] are: alkylchlorosilane such as $C_{18}H_{37}SiCl_3$, $C_{10}H_{21}SiCl_3$, $C_6H_{13}SiCl_3$, $C_3H_7SiCl_3$, $CH_3SiCl_3$, $C_{18}H_{37}Si(CH_3)Cl_2$, $C_{10}H_{21}Si(CH_3)Cl_2$, $C_6H_{13}Si(CH_3)Cl_2$, $C_3H_7Si(CH_3)Cl_2$, $(CH_3)_2SiCl_2$, $C_{18}H_{37}Si(CH_3)_2Cl$, $C_{10}H_{21}Si(CH_3)_2Cl$, $C_6H_{13}Si(CH_3)_2Cl$, $C_3H_7Si(CH_3)_2Cl$, $(CH_3)_3SiCl$, $(CH_3)_2SiHCl$ and the like; fluoroalkylchlorosilane such as $C_8F_{17}CH_2CH_2SiCl_3$, $C_6F_{13}CH_2CH_2SiCl_3$, $C_4F_9CH_2CH_2SiCl_3$, $CF_3CH_2CH_2SiCl_3$, $C_8F_{17}CH_2CH_2Si(CH_3)Cl_2$, $C_6F_{13}CH_2CH_2Si(CH_3)Cl_2$, $C_4F_9CH_2CH_2Si(CH_3)Cl_2$, $CF_3CH_2CH_2Si(CH_3)Cl_2$, $C_8F_{17}CH_2CH_2Si(CH_3)_2Cl$, $C_8F_{13}CH_2CH_2Si(CH_3)_2Cl$, $C_4F_9CH_2CH_2Si(CH_3)_2Cl$, $CF_3CH_2CH_2Si(CH_3)_2Cl$, $CF_3CH_2CH_2Si(CH_3)HCl$ and the like; or a water-repellent compound in which chloro group of the chlorosilane is substituted with halogen group other than chloro group, such as bromo group, isocyanate group, alkoxy group, acetoxy group, trifluoroacetoxy group, —OC(CH₃)=CHCOCH₃, —OC(CH₃)=N—Si(CH₃)₃, —OC(CF₃)=N—Si(CH₃)₃, —CO—NH—Si(CH₃)₃, alkylsulfonate group, perfluoroalkylsulfonate group, nitrile group, —NH₂, —N(CH₃)₂, —N(C₂H₅)₂, —NHCOCH₃, —N₃, —N=C=S, —N(CH₃)COCH₃, —N(CH₃)COCF₃, —N=C(CH₃)OSi(CH₃)₃, —N=C(CF₃)OSi(CH₃)₃, —NHCO—OSi(CH₃)₃, —NHCO—NH—Si(CH₃)₃, imidazole ring, oxazolidinone ring, morpholine ring or the like.

Additionally, when the water-repellent compound has two or more reactive moieties, the water-repellent compound tends to coagulate, so that the surface condition uniformly provided with water-repellency becomes hard to be obtained. As a result of this, in a process of irradiating the surface of the silicon wafer with light or a process of heating the silicon wafer, it becomes necessary to spare an additional time for light irradiation or heating in order to remove a region formed due to the coagulation of the water-repellent compound. Therefore, "4-a-b-c", which represents the number of the reactive moiety, is preferably 1.

Examples of usable water-repellent compound represented by the general formula [2] are $(CH_3)_3SiNHSi(CH_3)_3$, $C_2H_5Si(CH_3)_2NHSi(CH_3)_2C_2H_5$, $C_3H_7Si(CH_3)_2NHSi(CH_3)_2C_3H_7$, $C_6H_{13}Si(CH_3)_2NHSi(CH_3)_2C_6H_{13}$, $C_6H_5Si(CH_3)_2NHSi(CH_3)_2C_6H_5$, $\{(CH_3)_3Si\}_3N$, $\{C_2H_5Si(CH_3)_2\}_3N$, $(CH_3)_2HSiNHSi(CH_3)_2H$, $CF_3CH_2CH_2Si(CH_3)_2NHSi(CH_3)_2CH_2CH_2CF_3$, $C_4F_9CH_2CH_2Si(CH_3)_2NHSi(CH_3)_2CH_2CH_2C_4F_9$, $C_6F_{13}CH_2CH_2Si(CH_3)_2NHSi(CH_3)_2CH_2CH_2C_6F_{13}$, $C_8F_{17}CH_2CH_2Si(CH_3)_2NHSi(CH_3)_2CH_2CH_2C_8F_{17}$, $\{CF_3CH_2CH_2Si(CH_3)_2\}_3N$, and the like. Particularly, disilazane represented by the general formula [2] where e is 2 is preferable.

Among the above-mentioned examples of the water-repellent compound, the particularly preferable is chlorosilane in which X in the general formula [1] is chloro group from the viewpoint of attainability to the surface condition where the surfaces of the recessed portions are sufficiently provided with water-repellency in a short time.

Additionally, if water is present in the water-repellent cleaning liquid, the reactive moiety of the water-repellent compound is hydrolyzed to be silanol group (Si—OH). The reactive moiety is reactive with this silanol group. As a result, water-repellent compounds are bonded to each other to be a dimer. The dimer is low in reactivity with silanol group in the silicon oxide layer of the silicon wafer, so that the time required providing the surface of the silicon wafer with water repellency is increased. As the solvent for the water-repellent cleaning liquid, therefore, other than water, i.e. the above-mentioned organic solvent containing at least the alcoholic solvent is used.

Incidentally, the water-repellent cleaning liquid allows the presence of a small quantity of water in the solvent. However, when a large quantity of water is contained in the solvent, the water-repellent compound is hydrolyzed by the water content thereby sometimes decreasing in reactivity. It is therefore preferable to make the water content in the solvent low. The water content is preferably smaller than 3 times, more preferably 1 time, much more preferably smaller than 0.5 time the water-repellent compound in mole ratio, when mixed with the water-repellent compound.

Additionally, in order to accelerate the reaction between the water-repellent compound and the wafer surface, a catalyst may be added o the water-repellent cleaning liquid. The preferably used as such a catalyst are: acids containing no water such as trifluoroacetic acid, trifluoroacetic anhydride, pentafluoropropionic acid, pentafluoropropionic anhydride, trifluoromethanesulfonic acid, trifluoromethanesulfonic anhydride, sulfuric acid, hydrogen chloride and the like; bases such as ammonia, alkylamine, dialkylamine and the like; salts such as ammonium sulfide, potassium acetate, methylhydroxyamine hydrocholide; a metallic complex or a metallic salt of tin, aluminum, titanium or the like; chlorosilane; trimethylsilyltrifluoroacetonate; trimethylsilyltrifluoromethanesulfonate. Particularly, if taking a catalytic effect and cleanliness into account, the preferable are the acids containing no water such as trifluoroacetic acid, trifluoroacetic anhydride, trifluoromethanesulfonic acid, trifluoromethanesulfonic anhydride, sulfuric acid, hydrogen chloride and the like; chlorosilane; trimethylsilyltrifluoroacetonate; and trimethylsilyltrifluoromethanesulfonate.

The addition amount of the catalyst is preferably from 0.001 to 5 mass % relative to the total quantity of 100 mass % of the water-repellent compound. A small addition amount reduces the catalytic effect so as not to be preferable. Meanwhile, an excessively large amount raises a concern that the catalyst erodes the surface of the wafer or is left on the wafer as an impurity rather than improves the catalytic effect. Therefore, the addition amount of the catalyst is particularly preferably from 0.005 to 3 mass %.

Furthermore, when the temperature of the water-repellent cleaning liquid is high, the surfaces of the recessed portions can readily attain the surface condition provided with water repellency in a shorter time. The temperature at which the surface condition uniformly provided with water repellency is readily brought about is preferably maintained at 0 to 160° C., particularly preferably at 10 to 120° C. It is preferable to maintain the temperature of the water-repellent cleaning liquid at the temperature even when the water-repellent cleaning liquid is retained in the recessed portions 4.

Hereinafter, a description will be given about the second cleaning agent. In the water-repellent compound in the cleaning liquid B which compound has a hydrolyzable moiety which can form a unit chemically bondable to Si element in the silicon wafer and a hydrophobic group, examples of the hydrolyzable moiety are: alkoxy group such as methoxy group, ethoxy group, propoxy group, isopropoxy group, butoxy group and the like; Si—O—C bond with acetoxy group, trifluoroacetoxy group, —OC(CH_3)=CHCOCH_3 or the like; halogen group such as chloro group, bromo group and the like; Si—N bond with isocyanate group, amino group, isothiocyanate group, azide group, acetamide group, silazane, or the like; Si—O—S bond with alkylsulfonate group, perfluoroalkylsulfonate group or the like; nitrile group; and the like. Examples of the hydrophobic group include a monovalent organic group having hydrocarbon group and a monovalent organic group having C—F bond. Such a water-repellent compound is to react with silanol group of a silicon oxide layer of the uneven pattern of the silicon wafer, at a group generated by hydrolysis of the hydrolyzable moiety, so as to be fixed on the wafer. With this, it becomes possible to coat the surface of the wafer with the hydrophobic group thereby allowing reducing the capillary force.

Furthermore, in the cleaning liquid B, the water-repellent compound having a hydrolyzable moiety which can form a unit chemically bondable to Si element in the silicon wafer and a hydrophobic group is preferably comprised of at least one selected from the group consisting of

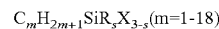
$C_mH_{2m+1}SiR_sX_{3-s}$ (m=1-18)

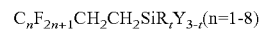
$C_nF_{2n+1}CH_2CH_2SiR_tY_{3-t}$ (n=1-8)

Here, s and t are integers of from 0 to 2. R is hydrogen atom or hydrocarbon group. X and Y are hydrolyzable moieties.

The surface condition provided with water repellency by such a water-repellent compound can be readily removed by the process of irradiating the surface of the silicon wafer with light or the process of heating the silicon wafer.

Examples of the water-repellent compound represented by $C_mH_{2m+1}SiR_sX_{3-s}$ (m=1-18, s is an integer of from 0 to 2, R is a hydrogen atom or a monovalent hydrocarbon group) are: alkylalkoxysilane such as $C_{18}H_{37}Si(OCH_3)_3$, $C_{10}H_{21}Si(OCH_3)_3$, $C_{18}H_{17}Si(OCH_3)_3$, $C_6H_{13}Si(OCH_3)_3$, $C_3H_7Si(OCH_3)_3$, $CH_3Si(OCH_3)_3$, $C_{18}H_{37}Si(CH_3)(OCH_3)_2$, $C_{10}H_{21}Si(CH_3)(OCH_3)_2$, $C_6H_{13}Si(CH_3)(OCH_3)_2$, $C_3H_7Si(CH_3)(OCH_3)_2$, $Si(CH_3)(OCH_3)_2$, $(CH_3)_2Si(OCH_3)_2$, $C_{18}H_{37}Si(CH_3)_2OCH_3$, $C_{10}H_{21}Si(CH_3)_2OCH_3$, $C_6H_{13}Si(CH_3)_2OCH_3$, $C_3H_7Si(CH_3)_2OCH_3$, $(CH_3)_3SiO\ CH_3$, $HSi(CH_3)_2OCH_3$, $C_{18}H_{37}Si(OC_2H_5)_3$, $C_{10}H_{21}Si(OC_2H_5)_3$, $C_6H_{13}Si(OC_2H_5)_3$, $C_3H_7Si(OC_2H_5)_3$, $CH_3Si(OC_2H_5)_3$, $C_{18}H_{37}Si(CH_3)(OC_2H_5)_2$, $C_{10}H_{21}Si(CH_3)(OC_2H_5)_2$, $C_6H_{13}Si(CH_3)(OC_2H_5)_2$, $C_3H_7Si(CH_3)(OC_2H_5)_2$, $(CH_3)_2Si(OC_2H_5)_2$, $C_{18}H_{37}Si(CH_3)_2OC_2H_5$, $C_{10}H_{21}Si(CH_3)_2OC_2H_5$, $C_6H_{13}Si(CH_3)_2OC_2H_5$, $C_3H_7Si(CH_3)_2OC_2H_5$, $(CH_3)_3$ $SiOC_2H_5$, $HSi(CH_3)_2OC_2H_5$ and the like; a silazane compound such as $(CH_3)_3SiNHSi(CH_3)_3$, $C_2H_5Si(CH_3)_2NHSi(CH_3)_2C_2H_5$, $C_3H_7Si(CH_3)_2NHSi(CH_3)_2C_3H_7$, $C_6H_{13}Si(CH_3)_2NHSi(CH_3)_2C_6H_{13}$, $C_6H_5Si(CH_3)_2NHSi(CH_3)_2C_6H_5$, $(CH_3)_3SiN\{Si(CH_3)_3\}_2$, $C_2H_5Si(CH_3)_2N\{Si(CH_3)_2C_2H_5\}_2$, $(CH_3)_2HSiNHSi(CH_3)_2H$ and the like; and alkylsilane obtained by substituting alkoxy group of the above-mentioned alkylalkoxysilane with chloro group, isocyanate group, amino group, dialkylamino group, —$NHCOCH_3$, —$N_3$, —$N=C=S$, —$N(CH_3)COCH_3$, —$N(CH_3)COCF_3$, —$N=C(CH_3)OSi(CH_3)_3$, —$N=C(CF_3)OSi(CH_3)_3$, —$NHCO-OSi(CH_3)_3$, —$NHCO-NH-Si(CH_3)_3$, imidazole ring, oxazolidinone ring, morpholine ring, acetoxy group, trifluoroacetoxy group, —$OC(CH_3)=CHCOCH_3$, nitrile group or the like.

Additionally, examples of the water-repellent compound represented by $C_nF_{2n+1}CH_2CH_2SiR_tY_{3-t}$ (n=1-8, t is an integer of from 0 to 2, R is hydrogen atom or a monovalent hydrocarbon group) include: fluoroalkylalkoxysilane such as $C_8F_{17}CH_2CH_2Si(OCH_3)_3$, $C_6F_{13}CH_2CH_2Si(OCH_3)_3$, $C_4F_9CH_2CH_2Si(OCH_3)_3$, $CF_3CH_2CH_2Si(OCH_3)_3$, $C_8F_{17}CH_2CH_2Si(OC_2H_5)_3$, $C_6F_{13}CH_2CH_2Si(OC_2H_5)_3$, $C_4F_9CH_2CH_2Si(OC_2H_5)_3$, $CF_3CH_2CH_2Si(OC_2H_5)_3$, $C_8F_{17}CH_2CH_2Si(CH_3)(OCH_3)_2$, $C_6F_{13}CH_2CH_2Si(CH_3)(OCH_3)_2$, $C_4F_9CH_2CH_2Si(CH_3)(OCH_3)_2$, $CF_3CH_2CH_2Si(CH_3)(OCH_3)_2$, $C_8F_{17}CH_2CH_2Si(CH_3)_2OCH_3$, $C_6F_{13}CH_2CH_2Si(CH_3)_2OCH_3$, $C_4F_9CH_2CH_2Si(CH_3)_2OCH_3$ and $CF_3CH_2CH_2Si(CH_3)_2OCH_3$; a silazane compound such as $CF_3CH_2CH_2Si(CH_3)_2NH\ Si(CH_3)_2CH_2CH_2CF_3$, $C_4F_9CH_2CH_2Si(CH_3)_2NHSi(CH_3)_2CH_2CH_2C_4F_9$, $C_6F_{13}CH_2CH_2Si(CH_3)_2NHSi(CH_3)_2CH_2CH_2C_6F_{13}$, $C_8F_{17}CH_2CH_2Si(CH_3)_2NHSi(CH_3)_2CH_2CH_2C_8F_{17}$, $CF_3CH_2CH_2Si(CH_3)_2N\{Si(CH_3)_2CH_2CH_2CF_3\}_2$ and the like; and alkylsilane obtained by substituting alkoxy group of the above-mentioned fluoroalkylalkoxysilane with chloro group, isocyanate group, amino group, dialkylamino group, —$NHCOCH_3$, —$N_3$, —$N=C=S$, —$N(CH_3)COCH_3$, —$N(CH_3)COCF_3$, —$N=C(CH_3)OSi(CH_3)_3$, —$N=C(CF_3)OSi(CH_3)_3$, —$NHCO-OSi(CH_3)_3$, —$NHCO-NH-Si(CH_3)_3$, imidazole ring, oxazolidinone ring, morpholine ring, acetoxy group, trifluoroacetoxy group, —$OC(CH_3)=CHCOCH_3$, nitrile group or the like.

Incidentally, it is particularly preferable from the viewpoint of hydrolytic reactivity that X and Y, which are hydrolyzable moieties, are methoxy group or ethoxy group.

It is preferable that the cleaning liquid B contains water or an acidic aqueous solution in order to accelerate the hydrolytic reaction of the water-repellent compound. Additionally, it is preferable to prepare the acidic aqueous solution contained in the cleaning liquid B to have a pH value of not higher than 5, particularly of from 0 to 4, because the hydrolytic reaction can be accelerated thereby. Usable acids are nitric acid, hydrochloric acid, acetic acid, sulfuric acid and the like.

Additionally, the amount of water to be contained in the cleaning liquid B is preferably 1 to 200 times the number of the unit the water-repellent compound has which unit is chemically bondable to Si element by the hydrolysis, in number of molecules. With the amount of lower than 1 time, there are some cases where the hydrolytic reaction cannot sufficiently proceed. Additionally, with the amount of higher than 200 times, the solubility of the water-repellent compound in the cleaning liquid B is sometimes reduced to sometimes bring about a case where an uniform cleaning liquid B is hard to be obtained or a case where the pot life of the cleaning liquid B is shortened. It is particularly preferable that the amount of water is 2 to 100 times.

Additionally, the particularly preferable alcoholic solvent in the cleaning liquid B is lower alcohol such as methanol, ethanol, 1-propanol, 2-propanol and the like.

It is preferable to obtain the cleaning liquid B by mixing the water-repellent compound with the alcoholic solvent with the addition of water or the acidic aqueous solution, followed by stirring. At this time, it becomes easy to uniformly mix the water-repellent compound and water or the acidic aqueous solution with a treatment liquid, by previously mixing the water-repellent compound and the alcoholic solvent.

By increasing the temperature of the cleaning liquid B, the surfaces of the recessed portions can readily attain the surface condition provided with water repellency in a short time. The temperature at which the surface condition uniformly provided with water repellency is readily brought about is preferably maintained at 10 to 120° C., particularly preferably at 20 to 80° C. It is preferable to maintain the temperature of the cleaning liquid B at the temperature even when the cleaning liquid B is retained in the recessed portions 4.

Thereafter, a step of removing the cleaning liquid retained in the recessed portions 4 provided with water repellency by the water-repellent compound and then removing the cleaning agent is conducted. It is preferale that this step includes:

a step of removing the cleaning liquid retained in the recessed portions from the recessed portions by drying; and a step of conducting at least one treatment selected from irradiating the surface of the silicon wafer with light, heating the silicon wafer, and exposing the silicon wafer to ozone.

It is preferable that the cleaning liquid retained in the recessed portions is the water-based cleaning liquid, when removing the cleaning liquid from the recessed portions. In this case, it is preferable to conduct a step of retaining the water-based cleaning liquid comprised of the water-based solution in the recessed portions through the substitution between the water-repellent cleaning liquid (the cleaning liquid B) retained in the recessed portions and the cleaning liquid "b" which is different from the water-repellent cleaning liquid, after a step of retaining the water-repellent cleaning liquid (the cleaning liquid B) in the recessed portions. Incidentally, the cleaning liquid retained in the recessed portions when the cleaning liquid is removed from the recessed portions may be either of the water-repellent cleaning liquid (the cleaning liquid B) and the different cleaning liquid "b".

In the step of removing the cleaning liquid from the recessed portions, the cleaning liquid is removed by drying. The drying is preferably conducted by a conventional drying method such as spin drying, IPA (2-propanol) steam drying, Marangoni drying, heating drying, warm air drying, vacuum drying and the like.

In the step of conducting at least one treatment selected from irradiating the surface of the silicon wafer with light, heating the silicon wafer, and exposing the silicon wafer to ozone, the surface condition 10 under which the surface of the silicon wafer is provided with water repellency is removed.

In the case where the surface condition 10 provided with water repellency is removed by light irradiation, it is effective to cleave Si—C bond, C—C bond and C—F bond in the surface condition 10 provided with water repellency by the water-repellent compound. In order to achieve this, it is preferable to conduct an irradiation with ultraviolet rays having wavelengths of 350-450 nm, 340 nm and shorter than 240 nm (corresponding to bond energies of them, i.e., 58-80 kcal/mol, 83 kcal/mol and 116 kcal/mol). As the light source therefor, there is used a metal halide lamp, a low-pressure mercury lamp, a high-pressure mercury lamp, an excimer lamp, a carbon arc or the like. The intensity of the ultraviolet irradiation is preferably not less than 100 mW/cm$^2$, particularly preferably not less than 200 mW/cm², for example, as a measurement value by the illuminance meter (an intensity strength meter UM-10 produced by Konica Minolta Sensing, Inc., Light-Receptor UM-360 [Peak sensitivity wavelength: 365 nm, measured wavelength range: 310 to 400 nm]). Incidentally, an irradiation intensity less than 100 mW/cm² takes a long time to remove the surface condition 10 provided with water repellency. Additionally, the low-pressure mercury lamp allows an irradiation with ultraviolet rays of shorter wavelengths, so as to be preferably used because the surface condition 10 provided with water repellency can be removed in a short time even if the intensity is low.

Additionally, in the case of removing the surface condition 10 provided with water repellency by light irradiation, it is particularly preferable to generate ozone in parallel with decomposing components of the surface condition 10 provided with water repellency by ultraviolet rays and then to induce oxidation-volatilization of the components of the surface condition 10 provided with water repellency by the ozone, since a treating time is to be saved thereby. As the light source therefor, the low-pressure mercury lamp or the excimer lamp is used. Additionally, the silicon wafer may be heated while being irradiated with light.

In the case of heating the silicon wafer, heating of the silicon wafer is conducted at 400 to 700° C., preferably at 500 to 700° C. It is preferable to keep the heating time from 1 to 60 min, preferably from 10 to 30 min. Additionally, this step may be conducted in combination with ozone exposure, plasma irradiation, corona discharge or the like. Additionally, the light irradiation may be conducted while heating the silicon wafer.

In the case of exposing the silicon wafer to ozone, it is preferable to provide ozone generated by ultraviolet irradiation using the low-pressure mercury lamp, low-temperature discharge using high voltage or the like, to the surface of the silicon wafer. The silicon wafer may be irradiated with light or may be heated while being exposed to ozone.

In the step of removing the surface condition 10 of the surface of the silicon wafer which condition is provided with water repellency, the surface condition 10 can be efficiently removed by combining the above-mentioned light irradiation treatment, the heating treatment or the ozone-exposure treatment therewith. Additionally, this step may be combined with plasma irradiation, corona discharge or the like.

EXAMPLES

To make a silicon wafer have a surface with a finely uneven pattern and to substitute a cleaning liquid retained in recessed portions with another cleaning liquid are already-established techniques, as discussed in conventionally known literatures and the like. In the present invention, therefore, evaluations of a water-repellent cleaning liquid were mainly performed. Additionally, a pattern collapse greatly depends on the contact angle of the cleaning liquid to the surface of the silicon wafer or the contact angle of liquid drop and on the surface tension of the cleaning liquid, as clearly represented by the equation discussed in the background technique and the like $P=2\times\gamma\times\cos\theta/S$ ($\gamma$: Surface tension, $\theta$: Contact angle, S: Pattern width).

In a case of a cleaning liquid retained in recessed portions 4 of an uneven pattern 2, the contact angle of liquid drop and the capillary force of surfaces of the recessed portions which force can be regarded as an equivalent of the pattern collapse are in correlation with each other, so that the capillary force may be derived from the equation and the evaluation of the contact angle of liquid drop under the surface condition 10 provided with water repellency. Incidentally, in Examples, a representative of a water-based cleaning liquid, i.e., water was used.

However, in a case where the silicon wafer has a finely uneven pattern at its surface, the pattern is significantly fine. Therefore it is not possible to exactly evaluate the water repellency of a water repellency-provided surface condition 10 itself.

Evaluation of the contact angle of waterdrop for evaluating the water repellency is conducted by dropping several microliters of waterdrop on a surface of a sample (substrate) and then by measuring an angle formed between the waterdrop and the substrate surface, as discussed in JIS R 3257 (Testing method of wettability of glass substrate surface). However, in the case of the silicon wafer having a pattern, the contact angle is enormously large. This is because Wenzel's effect or Cassie's effect is caused. That is because an apparent contact angle of the waterdrop is increased under the influence of a surface shape (roughness) of the substrate upon the contact angle.

In view of this, in the present invention, evaluations are performed by providing the water-repellent cleaning liquid (a cleaning liquid B) to a silicon wafer having a smooth surface so as to impart a surface condition provided with water-repellency therewith and then regarding the surface condition as a water repellency-provided surface condition 10 of a silicon wafer 1 at which surface an uneven pattern 2 is formed.

Details will be discussed below. Hereinafter, there will be discussed: an evaluation method for a silicon wafer provided with a water-repellent cleaning liquid (a cleaning liquid B); preparation of the water-repellent cleaning liquid (the cleaning liquid B); and evaluation results after providing the water-repellent cleaning liquid (the cleaning liquid B) to the silicon wafer.

[Evaluation Method for Silicon Wafer to which Water-Repellent Cleaning Liquid (Cleaning Liquid B) is Provided]

As an evaluation method for the silicon wafer provided with the water-repellent cleaning liquid (the cleaning liquid B), the following evaluations (1) to (4) were performed.

(1) Evaluation of Contact Angle under Surface Condition provided with Water Repellency by Water-Repellent Cleaning Liquid (Cleaning Liquid B)

Pure water of about 2 microliters was dropped on a wafer surface provided with water repellency, followed by measuring an angle (contact angle) formed between the waterdrop and the wafer surface by a contact angle meter (produced by Kyowa Interface Science Co., Ltd.: CA-X Model). At this time, a water repellency-provided surface condition having a contact angle within a range of from 50 to 120° was determined as an acceptable one (indicated in Tables with "A").

(2) Evaluation of Capillary Force

The capillary force (the absolute value of P) was obtained by calculating P by using the following equation.

$P=2\times\gamma\times\cos\theta/S$

Here, $\gamma$ represents a surface tension, $\theta$ represents a contact angle, and S represents a pattern width. Incidentally, in a pattern having a line width of 45 nm and an aspect ratio of 6, the pattern tends to collapse in a case where the cleaning liquid used when the wafer passes through an gas-liquid interface is water, while being difficult to collapse in a case of 2-propanol. In a case where the pattern width is 45 nm and the wafer surface is silicon oxide, when the cleaning liquid is 2-propanol (Surface tension: 22 mN/m, Contact angle to silicon oxide: 1°), the capillary force is 0.98 MN/m². On the other hand, in a case of water having the largest surface tension among liquids other than mercury (Surface tension: 72 mN/m, Contact angle to silicon oxide: 2.5°), the capillary force is 3.2 MN/m². In view of this, the objective was set to the midpoint, i.e., 2.1 MN/m². A capillary force of not greater than 2.1 MN/m², at the time of retaining water, was determined as an acceptable one (indicated in Tables with "A").

(3) Removability for Surface Condition Provided with Water Repellency by Water-Repellent Cleaning Liquid (Cleaning Liquid B)

Under the following conditions, the sample was irradiated with UV rays from a metal halide lamp for 2 hours. Those having a contact angle to waterdrop of not larger than 30° after the irradiation were determined as acceptable ones (indicated in Tables with "A").

Lamp: M015-L312 produced by EYE GRAPHICS CO., LTD. (Intensity: 1.5 kW)
Illuminance: 128 mW/cm² as a measurement value under the following conditions
Measuring Apparatus: Ultraviolet Intensity Meter (UM-10 produced by Konica Minolta Sensing, Inc.)
Light-Receptor: UM-360
(Light-Receptive Wavelength: 310-400 nm, Peak Wavelength: 365 nm)
Measuring Mode: Irradiance Measurement (4) Evaluation of Surface Smoothness of Silicon Wafer after Removing Water Repellency-Provided Surface Condition The surface was observed by atomic force microscope (produced by Seiko Instruments Inc.: SPI3700, 2.5 micrometer square scan), thereby obtaining the centerline average surface roughness: Ra (nm). Incidentally, Ra is a three-dimensionally enlarged one obtained by applying the centerline average roughness defined by JIS B 0601 to a measured surface and is calculated as "an average value of absolute values of difference from standard surface to designated surface" from the following equation. If the wafer has an Ra value of not higher than 1 nm after removing the water repellency-provided surface condition, the wafer surface was considered not to be eroded and not to have a residue of the water-repellent cleaning liquid (the cleaning liquid B) thereon, so as to be determined as an acceptable one (indicated in Tables with "A").

[Mathematical Equation 1]

$$Ra = \frac{1}{S_0} \int_{Y_T}^{Y_B} \int_{X_L}^{X_R} |F(X, Y) - Z_0| dX dY$$

Here, $X_L$ and $X_R$ and $Y_B$ and $Y_T$ represent a measuring range in the X coordinate and the Y coordinate, respectively. So is an area on the assumption that a measured surface is ideally flat, and is a value obtained by $(X_R-X_L) \times (Y_B-Y_T)$. Additionally, $F(X,Y)$ represents the height at a measured point $(X,Y)$. $Z_0$ represents the average height within the measured surface.

The following Examples 1 to 45 exemplifies a first cleaning agent and the following Comparative Examples 1 and 2 are opposed to the first cleaning agent. Results of these are shown in Table 1 and Table 2.

Example 1

(1) Preparation of Water-Repellent Cleaning Liquid 3 g of trimethylchlorosilane $[(CH_3)_3SiCl]$ serving as a water-repellent compound and a mixture of 5 g of 2-propanol (iPA) serving as an alcoholic solvent and 92 g of toluene serving as an organic solvent other than the alcoholic solvent were mixed and stirred for 5 min, thereby obtaining a water-repellent cleaning liquid having a concentration of the water-repellent compound (hereinafter referred to as "a water-repellent compound concentration") of 3 mass % relative to the total quantity of the water-repellent cleaning liquid and a concentration of the alcoholic solvent (hereinafter referred to as "an alcohol concentration") of 5 mass % relative to the total quantity of the water-repellent cleaning liquid.

(2) Cleaning of Silicon Wafer

A smooth silicon wafer having a thermal oxide film (a silicon wafer having on its surface a thermal oxide film layer of 1 micrometer thickness) was immersed in 1 mass % hydrofluoric acid aqueous solution for 2 min, followed by being immersed in pure water for 1 min and then in acetone for 1 min.

(3) Surface Treatment of Silicon Wafer Surface with Water-Repellent Cleaning Liquid The silicon wafer was immersed in the water-repellent cleaning liquid prepared in the "(1) Preparation of Water-Repellent Cleaning Liquid" at 20° C. for 10 min. Thereafter, the silicon wafer was immersed in iPA for 1 min, followed by being immersed in pure water serving as a water-based cleaning liquid for 1 min. Finally, the silicon wafer was drawn out of the pure water and then an air was sprayed thereon, thereby removing the pure water from the surface.

As a result of evaluating the obtained wafer in a manner discussed in the [Evaluation Method for Silicon Wafer to which Water-Repellent Cleaning Liquid (Cleaning liquid B) is provided], one which had an initial contact angle of smaller than 10° before a surface treatment changed to have a contact angle of 70° after the surface treatment as shown in Table 1, thereby exhibiting a water repellency-providing effect. Additionally, as a result of calculating the capillary force at the time where water was retained by using the equation discussed in the above-mentioned "Evaluation of Capillary Force", the capillary force was 1.1 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

TABLE 1

| | Water-repellent cleaning liquid | | | | | Treatment before surface treatment with water-repellent cleaning liquid | Treatment after surface treatment with water-repellent cleaning liquid | | | |
|---|---|---|---|---|---|---|---|---|---|---|
| | Water-repellent compound | | Organic solvent | | | Solvent used For cleaning after rinsing with water | Immersion | | Drying | Cleaning with solvent |
| | Water-repellent compound | concentration [mass %] | Alcoholic solvent | Alcohol concentration [mass %] | Organic solvent other than alcoholic solvent | | Temperature [° C.] | Time [min] | | |
| Example 1 | $(CH_3)_3SiCl$ | 3 | iPA | 5 | Toluene | Acetone | 20 | 10 | Not performed | Performed |
| Example 2 | $(CH_3)_3SiCl$ | 1 | iPA | 5 | Toluene | Acetone | 20 | 10 | Not performed | Performed |
| Example 3 | $(CH_3)_3SiCl$ | 3 | iPA | 10 | Toluene | Acetone | 20 | 10 | Not performed | Performed |
| Example 4 | $(CH_3)_3SiCl$ | 3 | nPA | 5 | Toluene | Acetone | 20 | 10 | Not performed | Performed |
| Example 5 | $(CH_3)_3SiCl$ | 3 | Ethanol | 5 | Toluene | Acetone | 20 | 10 | Not performed | Performed |
| Example 6 | $(CH_3)_3SiCl$ | 3 | 1-Butanol | 5 | Toluene | Acetone | 20 | 10 | Not performed | Performed |
| Example 7 | $(CH_3)_3SiCl$ | 3 | 1-Heptanol | 5 | Toluene | Acetone | 20 | 10 | Not performed | Performed |
| Example 8 | $(CH_3)_3SiCl$ | 3 | iPA | 5 | AE3000 | Acetone | 20 | 10 | Not performed | Performed |
| Example 9 | $(CH_3)_3SiCl$ | 3 | iPA | 5 | HFE-7100 | Acetone | 20 | 10 | Not performed | Performed |
| Example 10 | $(CH_3)_3SiCl$ | 3 | iPA | 5 | CTFP | Acetone | 20 | 10 | Not performed | Performed |
| Example 11 | $(CH_3)_3SiCl$ | 3 | iPA | 5 | DCTFP | Acetone | 20 | 10 | Not performed | Performed |
| Example 12 | $CF_3CH_2CH_2Si(CH_3)_2Cl$ | 3 | iPA | 5 | Toluene | Acetone | 20 | 10 | Not performed | Performed |
| Example 13 | $CF_3(CF_2)_3CH_2CH_2Si(CH_3)_2Cl$ | 3 | iPA | 5 | Toluene | Acetone | 20 | 10 | Not performed | Performed |
| Example 14 | $(CH_3)_3SiCl$ | 3 | iPA | 5 | Toluene | iPA | 20 | 10 | Not performed | Performed |
| Example 15 | $(CH_3)_3SiCl$ | 3 | iPA | 5 | HFE-7100 | iPA | 20 | 10 | Not performed | Performed |
| Example 16 | $(CH_3)_3SiCl$ | 3 | iPA | 5 | CTFP | iPA | 20 | 10 | Not performed | Performed |
| Example 17 | $(CH_3)_3SiCl$ | 3 | nPA | 5 | HFE-7100 | iPA | 20 | 10 | Not performed | Performed |
| Example 18 | $(CH_3)_3SiCl$ | 3 | nPA | 5 | CTFP | iPA | 20 | 10 | Not performed | Performed |

TABLE 1-continued

| Example | | | | | | | | |
|---|---|---|---|---|---|---|---|---|
| Example 19 | 5 | (CH$_3$)$_3$SiCl | 5 | nPA | HFE-7100 | 20 | 10 | Not performed | Performed |
| Example 20 | 10 | (CH$_3$)$_3$SiCl | 5 | nPA | HFE-7100 | 20 | 10 | Not performed | Performed |
| Example 21 | 50 | (CH$_3$)$_3$SiCl | 5 | nPA | HFE-7100 | 20 | 10 | Not performed | Performed |
| Example 22 | 5 | (CH$_3$)$_3$SiCl | 95 | nPA | — | 20 | 10 | Not performed | Performed |
| Example 23 | 10 | (CH$_3$)$_3$SiCl | 90 | nPA | — | 20 | 10 | Not performed | Performed |
| Example 24 | 50 | (CH$_3$)$_3$SiCl | 50 | nPA | — | 20 | 10 | Not performed | Performed |
| Example 25 | 3 | (CH$_3$)$_3$SiCl | 5 | iPA | HFE-7100 | 20 | 10 | Not performed | Not performed |

Evaluation results

| | Treatment after surface treatment with water-repellent cleaning liquid | | Initial contact angle [°] | Contact angle after surface treatment [°] | Capillary force [MN/m²] <calculated value> | Removability of water-repellent surface | condition (contact angle [°]) | Surface smoothness (Ra [nm]) |
|---|---|---|---|---|---|---|---|---|
| | Cleaning with water | Drying | | | | | | |
| Example 1  | Performed | Performed | <10 | A (70) | A (1.1) | 10 | A (<10) | A (<0.5) |
| Example 2  | Performed | Performed | <10 | A (66) | A (1.3) | 10 | A (<10) | A (<0.5) |
| Example 3  | Performed | Performed | <10 | A (68) | A (1.2) | 10 | A (<10) | A (<0.5) |
| Example 4  | Performed | Performed | <10 | A (70) | A (1.1) | 10 | A (<10) | A (<0.5) |
| Example 5  | Performed | Performed | <10 | A (70) | A (1.1) | 10 | A (<10) | A (<0.5) |
| Example 6  | Performed | Performed | <10 | A (70) | A (1.1) | 10 | A (<10) | A (<0.5) |
| Example 7  | Performed | Performed | <10 | A (70) | A (1.1) | 10 | A (<10) | A (<0.5) |
| Example 8  | Performed | Performed | <10 | A (72) | A (1.0) | 10 | A (<10) | A (<0.5) |
| Example 9  | Performed | Performed | <10 | A (76) | A (0.8) | 10 | A (<10) | A (<0.5) |
| Example 10 | Performed | Performed | <10 | A (72) | A (1.0) | 10 | A (<10) | A (<0.5) |
| Example 11 | Performed | Performed | <10 | A (72) | A (1.0) | 10 | A (<10) | A (<0.5) |
| Example 12 | Performed | Performed | <10 | A (66) | A (1.3) | 10 | A (<10) | A (<0.5) |
| Example 13 | Performed | Performed | <10 | A (70) | A (1.1) | 10 | A (<10) | A (<0.5) |
| Example 14 | Performed | Performed | <10 | A (70) | A (1.1) | 10 | A (<10) | A (<0.5) |
| Example 15 | Performed | Performed | <10 | A (74) | A (0.9) | 10 | A (<10) | A (<0.5) |
| Example 16 | Performed | Performed | <10 | A (72) | A (1.0) | 10 | A (<10) | A (<0.5) |
| Example 17 | Performed | Performed | <10 | A (80) | A (0.6) | 10 | A (<10) | A (<0.5) |
| Example 18 | Performed | Performed | <10 | A (78) | A (0.7) | 10 | A (<10) | A (<0.5) |
| Example 19 | Performed | Performed | <10 | A (82) | A (0.4) | 10 | A (<10) | A (<0.5) |
| Example 20 | Performed | Performed | <10 | A (82) | A (0.4) | 10 | A (<10) | A (<0.5) |
| Example 21 | Performed | Performed | <10 | A (84) | A (0.3) | 10 | A (<10) | A (<0.5) |
| Example 22 | Performed | Performed | <10 | A (74) | A (0.9) | 10 | A (<10) | A (<0.5) |
| Example 23 | Performed | Performed | <10 | A (78) | A (0.7) | 10 | A (<10) | A (<0.5) |
| Example 24 | Performed | Performed | <10 | A (80) | A (0.6) | 10 | A (<10) | A (<0.5) |
| Example 25 | Performed | Performed | <10 | A (74) | A (0.9) | 10 | A (<10) | A (<0.5) |

Example 2

The manner was all the same as Example 1 with the exception that the water-repellent compound concentration was set to 1 mass %. As shown in the evaluation result of Table 1, the contact angle after the surface treatment was 66 and therefore the water repellency-providing effect was exhibited. Additionally, the capillary force at the time where water was retained was 1.3 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 3

The manner was all the same as Example 1 with the exception that the alcohol concentration was set to 10 mass %. As shown in the evaluation result of Table 1, the contact angle after the surface treatment was 68° and therefore the water repellency-providing effect was exhibited. Additionally, the capillary force at the time where water was retained was 1.2 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 4

The manner was all the same as Example 1 with the exception that 1-propanol (nPA) was used as the alcoholic solvent. As shown in the evaluation result of Table 1, the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 5

The manner was all the same as Example 1 with the exception that ethanol was used as the alcoholic solvent. As shown in the evaluation result of Table 1, the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 6

The manner was all the same as Example 1 with the exception that 1-butanol was used as the alcoholic solvent. As shown in the evaluation result of Table 1, the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 7

The manner was all the same as Example 1 with the exception that 1-hexanol was used as the alcoholic solvent. As shown in the evaluation result of Table 1, the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 8

The manner was all the same as Example 1 with the exception that a fluorine-based solvent (ASAHIKLIN AE3000 produced by Asahi Glass Co., Ltd.: Hydrofluoroether) was used as the organic solvent other than the alcoholic solvent in the water-repellent cleaning liquid. As shown in the evaluation result of Table 1, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 9

The manner was all the same as Example 1 with the exception that a fluorine-based solvent (Novec HFE-7100 produced by 3M Limited: Hydrofluoroether) was used as the organic solvent other than the alcoholic solvent in the water-repellent cleaning liquid. As shown in the evaluation result of Table 1, the contact angle after the surface treatment was 76° and therefore the water repellency-providing effect was exhibited. Additionally, the capillary force at the time where water was retained was 0.8 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 10

The manner was all the same as Example 1 with the exception that 1-chloro-3,3,3-trifluoropropene (CTFP) was used as the organic solvent other than the alcoholic solvent in the water-repellent cleaning liquid. As shown in the evaluation result of Table 1, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 11

The manner was all the same as Example 1 with the exception that 1,2-dichloro-3,3,3-trifluoropropene (DCTFP) was used as the organic solvent other than the alcoholic solvent in the water-repellent cleaning liquid. As shown in the evaluation result of Table 1, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 12

The manner was all the same as Example 1 with the exception that trifrluoropropyldimethylchlorosilane [$CF_3CH_2CH_2Si(CH_3)_2Cl$] was used as the water-repellent compound. As shown in the evaluation result of Table 1, the contact angle after the surface treatment was 66° and therefore the water repellency-providing effect was exhibited. Additionally, the capillary force at the time where water was retained was 1.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 13

The manner was all the same as Example 1 with the exception that nonafluorohexyldimethylchlorosilane [$CF_3(CF_2)CH_2CH_2Si(CH_3)_2Cl$] was used as the water-repellent compound. As shown in the evaluation result of Table 1, the contact angle after the surface treatment was 70° and therefore the water repellency-providing effect was exhibited. Additionally, the capillary force at the time where water was retained was 1.1 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 14

The manner was all the same as Example 1 with the exception that the silicon wafer was immersed in hydrofluoric acid aqueous solution for 2 min, followed by being immersed in pure water for 1 min and then in iPA for 1 min, in "(2) Cleaning of Silicon Wafer". As shown in the evaluation result of Table 1, the contact angle after the surface treatment was 70° and therefore the water repellency-providing effect was exhibited. Additionally, the capillary force at the time where water was retained was 1.1 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 15

The manner was all the same as Example 14 with the exception that HFE-7100 was used as the organic solvent other than the alcoholic solvent in the water-repellent cleaning liquid. As shown in the evaluation result of Table 1, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 16

The manner was all the same as Example 14 with the exception that CTFP was used as the organic solvent other than the alcoholic solvent in the water-repellent cleaning liquid. As shown in the evaluation result of Table 1, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 17

The manner was all the same as Example 15 with the exception that 1-propanol (nPA) was used as the alcoholic solvent. As shown in the evaluation result of Table 1, the contact angle after the surface treatment was 80° and therefore the water repellency-providing effect was exhibited. Additionally, the capillary force at the time where water was retained was 0.6 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 18

The manner was all the same as Example 17 with the exception that CTFP was used as the organic solvent other than the alcoholic solvent in the water-repellent cleaning liquid. As shown in the evaluation result of Table 1, the contact angle after the surface treatment was 78° and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 19

The manner was all the same as Example 17 with the exception that the water-repellent compound concentration was set to 5 mass %. As shown in the evaluation result of Table 1, the contact angle after the surface treatment was 82° and therefore the water repellency-providing effect was exhibited. Additionally, the capillary force at the time where water was retained was 0.4 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 20

The manner was all the same as Example 17 with the exception that the water-repellent compound concentration was set to 10 mass %. As shown in the evaluation result of Table 1, the contact angle after the surface treatment was 82° and therefore the water repellency-providing effect was exhibited. Additionally, the capillary force at the time where water was retained was 0.4 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 21

The manner was all the same as Example 17 with the exception that the water-repellent compound concentration was set to 50 mass %. As shown in the evaluation result of Table 1, the contact angle after the surface treatment was 84° and therefore the water repellency-providing effect was exhibited. Additionally, the capillary force at the time where water was retained was 0.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 22

The manner was all the same as Example 19 with the exception that 1-propanol (nPA) was singly used as the organic solvent in the water-repellent cleaning liquid. As shown in the evaluation result of Table 1, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 23

The manner was all the same as Example 22 with the exception that the water-repellent compound concentration was set to 10 mass %. As shown in the evaluation result of Table 1, the contact angle after the surface treatment was 78° and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 24

The manner was all the same as Example 22 with the exception that the water-repellent compound concentration was set to 50 mass %. As shown in the evaluation result of Table 1, the contact angle after the surface treatment was 80° and therefore the water repellency-providing effect was exhibited. Additionally, the capillary force at the time where water was retained was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 25

The manner was all the same as Example 15 with the exception that, in "(3) Surface Treatment of Silicon Wafer Surface with Water-Repellent Cleaning Liquid", the silicon wafer was immersed in pure water for 1 min after being immersed in the water-repellent cleaning liquid, followed by spraying air on the silicon wafer finally drawn out of the pure water to obtain a wafer with the water repellency-provided surface condition. As shown in the evaluation result of Table 1, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 26

The manner was all the same as Example 25 with the exception that CTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

TABLE 2

| | Water-repellent cleaning liquid | | | | | Treatment before surface treatment with water-repellent cleaning liquid Solvent used for cleaning after rinsing with water | Immersion | | Treatment after surface treatment with water-repellent cleaning liquid | |
|---|---|---|---|---|---|---|---|---|---|---|
| | | | Organic solvent | | | | | | | |
| | Water-repellent compound | Water-repellent compound concentration [mass %] | Alcoholic solvent | Alcohol concentration [mass %] | Organic solvent other than alcoholic solvent | | Temperature [° C.] | Time [min] | Drying | Cleaning with solvent |
| Example 26 | $(CH_3)_3SiCl$ | 3 | iPA | 5 | CTFP | iPA | 20 | 10 | Not performed | Not performed |
| Example 27 | $(CH_3)_3SiCl$ | 3 | iPA | 5 | DCTFP | iPA | 20 | 10 | Not performed | Not performed |
| Example 28 | $(CH_3)_3SiCl$ | 3 | iPA | 5 | HFE-7100 | iPA | 20 | 10 | Performed | Performed |
| Example 29 | $(CH_3)_3SiCl$ | 3 | iPA | 5 | HFE-7100 | iPA | 20 | 10 | Performed | Performed |
| Example 30 | $(CH_3)_3SiCl$ | 3 | iPA | 5 | CTFP | iPA | 20 | 10 | Performed | Performed |
| Example 31 | $(CH_3)_3SiCl$ | 3 | iPA | 5 | HFE-7100 | iPA | 20 | 10 | Performed | Not performed |
| Example 32 | $(CH_3)_3SiCl$ | 3 | iPA | 5 | CTFP | iPA | 20 | 10 | Performed | Not performed |
| Example 33 | $(CH_3)_3SiCl$ | 3 | iPA | 5 | HFE-7100 | iPA | 20 | 10 | Performed | Not performed |
| Example 34 | $(CH_3)_3SiCl$ | 3 | iPA | 5 | CTFP | iPA | 20 | 10 | Performed | Not performed |
| Example 35 | $(CH_3)_3SiCl$ | 3 | iPA | 5 | DCTFP | iPA | 20 | 10 | Performed | Not performed |
| Example 36 | $(CH_3)_3SiCl$ | 3 | iPA | 5 | HFE-7100 | iPA | 20 | 10 | Not performed | Performed |
| Example 37 | $(CH_3)_3SiCl$ | 3 | iPA | 5 | CTFP | iPA | 20 | 10 | Not performed | Performed |
| Example 38 | $(CH_3)_3SiCl$ | 3 | iPA | 5 | DCTFP | iPA | 20 | 10 | Not performed | Performed |
| Example 39 | $(CH_3)_3SiCl$ | 3 | iPA | 5 | Toluene | iPA, Toluene | 20 | 10 | Not performed | Performed |
| Example 40 | $(CH_3)_3SiCl$ | 3 | iPA | 5 | HFE-7100 | iPA, HFE-7100 | 20 | 10 | Not performed | Performed |

TABLE 2-continued

| | | | | | | | | | | |
|---|---|---|---|---|---|---|---|---|---|---|
| Example 41 | (CH₃)₃SiCl | 3 | iPA | 5 | HFE-7100 | None | 20 | 10 | Not performed | Performed |
| Example 42 | (CH₃)₃SiCl | 3 | iPA | 5 | CTFP | None | 20 | 10 | Not performed | Performed |
| Example 43 | (CH₃)₃SiCl | 3 | iPA | 5 | DCTFP | None | 20 | 10 | Not performed | Performed |
| Example 44 | C₂H₅Si(CH₃)₂Cl | 3 | iPA | 5 | HFE-7100 | iPA | 20 | 10 | Not performed | Performed |
| Example 45 | C₃H₇Si(CH₃)₂Cl | 3 | iPA | 5 | HFE-7100 | iPA | 20 | 10 | Not performed | Performed |
| Comparative Example 1 | Not treated | — | — | — | — | Acetone | — | — | Not performed | Performed |
| Comparative Example 2 | Hydrolysate of (CH₃)₃SiCl | 3 | iPA | 94.6 | — | Acetone | 20 | 10 | Not performed | Performed |

| | Treatment after surface treatment with water-repellent cleaning liquid | | Initial contact angle [°] | Evaluation results | | | | Removability of water-repellent surface | | | |
|---|---|---|---|---|---|---|---|---|---|---|---|
| | Cleaning with water | Drying | | Contact angle after surface treatment [°] | | Capillary force [MN/m²] <calculated value> | | condition (contact angle [°]) | | Surface smoothness (Ra [nm]) | |
| Example 26 | Performed | Performed | <10 | A | (72) | A | (1.0) | A | (<10) | A | (<0.5) |
| Example 27 | Performed | Performed | <10 | A | (72) | A | (1.0) | A | (<10) | A | (<0.5) |
| Example 28 | Performed | Performed | <10 | A | (74) | A | (0.9) | A | (<10) | A | (<0.5) |
| Example 29 | Not performed | Performed | <10 | A | (72) | A | (1.0) | A | (<10) | A | (<0.5) |
| Example 30 | Not performed | Performed | <10 | A | (72) | A | (1.0) | A | (<10) | A | (<0.5) |
| Example 31 | Performed | Performed | <10 | A | (74) | A | (0.9) | A | (<10) | A | (<0.5) |
| Example 32 | Performed | Performed | <10 | A | (72) | A | (1.0) | A | (<10) | A | (<0.5) |
| Example 33 | Not performed | Not performed | <10 | A | (74) | A | (0.9) | A | (<10) | A | (<0.5) |
| Example 34 | Not performed | Not performed | <10 | A | (72) | A | (1.0) | A | (<10) | A | (<0.5) |
| Example 35 | Not performed | Not performed | <10 | A | (72) | A | (1.0) | A | (<10) | A | (<0.5) |
| Example 36 | Not performed | Performed | <10 | A | (74) | A | (0.9) | A | (<10) | A | (<0.5) |
| Example 37 | Not performed | Performed | <10 | A | (72) | A | (1.0) | A | (<10) | A | (<0.5) |
| Example 38 | Not performed | Performed | <10 | A | (72) | A | (1.0) | A | (<10) | A | (<0.5) |
| Example 39 | Performed | Performed | <10 | A | (70) | A | (1.1) | A | (<10) | A | (<0.5) |
| Example 40 | Performed | Performed | <10 | A | (74) | A | (0.1) | A | (<10) | A | (<0.5) |
| Example 41 | Performed | Performed | <10 | A | (74) | A | (0.9) | A | (<10) | A | (<0.5) |
| Example 42 | Performed | Performed | <10 | A | (72) | A | (1.0) | A | (<10) | A | (<0.5) |
| Example 43 | Performed | Performed | <10 | A | (72) | A | (1.0) | A | (<10) | A | (<0.5) |
| Example 44 | Performed | Performed | <10 | A | (78) | A | (0.7) | A | (<10) | A | (<0.5) |
| Example 45 | Performed | Performed | <10 | A | (82) | A | (0.5) | A | (<10) | A | (<0.5) |
| Comparative Example 1 | Performed | Performed | <10 | B | (3) | B | (3.2) | — | | A | (<0.5) |
| Comparative Example 2 | Performed | Performed | <10 | B | (14) | B | (3.1) | — | | — | |

Example 27

The manner was all the same as Example 25 with the exception that DCTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 28

The manner was all the same as Example 15 with the exception that, in "(3) Surface Treatment of Silicon Wafer Surface with Water-Repellent Cleaning Liquid", the silicon wafer was immersed in the water-repellent cleaning liquid, followed by spraying air thereon to remove the water-repellent cleaning liquid from the surface and that the silicon wafer was thereafter immersed in iPA for 1 min and then in pure water for 1 min and finally drawn out of the pure water, followed by spraying air thereon to remove the pure water from the surface to obtain a wafer with the water repellency-provided surface condition. As shown in the evaluation result of Table 2, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 29

The manner was all the same as Example 15 with the exception that, in "(3) Surface Treatment of Silicon Wafer Surface with Water-Repellent Cleaning Liquid", the silicon wafer was immersed in the water-repellent cleaning liquid, followed by spraying air thereon to remove the water-repellent cleaning liquid from the surface and that the silicon wafer was thereafter immersed in iPA for 1 min and finally drawn out of iPA, followed by spraying air thereon to remove iPA from the surface to obtain a wafer with the water repellency-provided surface condition. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 30

The manner was all the same as Example 29 with the exception that CTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 31

The manner was all the same as Example 15 with the exception that, in "(3) Surface Treatment of Silicon Wafer Surface with Water-Repellent Cleaning Liquid", the silicon wafer was immersed in the water-repellent cleaning liquid, followed by spraying air thereon to remove the water-repellent cleaning liquid from the surface and that the silicon wafer was thereafter immersed in pure water for 1 min and finally drawn out of the pure water, followed by spraying air thereon to remove the pure water from the surface to obtain a wafer with the water repellency-provided surface condition. As shown in the evaluation result of Table 2, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 32

The manner was all the same as Example 31 with the exception that CTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 33

The manner was all the same as Example 15 with the exception that, in "(3) Surface Treatment of Silicon Wafer Surface with Water-Repellent Cleaning Liquid", the silicon wafer was drawn out of the water-repellent cleaning liquid, followed by spraying air thereon to obtain a wafer with the water repellency-provided surface condition. As shown in the evaluation result of Table 2, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 34

The manner was all the same as Example 33 with the exception that CTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 35

The manner was all the same as Example 33 with the exception that DCTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 36

The manner was all the same as Example 15 with the exception that, in "(3) Surface Treatment of Silicon Wafer Surface with Water-Repellent Cleaning Liquid", the silicon wafer was immersed in iPA for 1 min after being immersed in the water-repellent cleaning liquid and finally drawn out of iPA, followed by spraying air thereon to remove iPA from the surface to obtain a wafer with the water repellency-provided surface condition. As shown in the evaluation result of Table 2, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 37

The manner was all the same as Example 36 with the exception that CTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 38

The manner was all the same as Example 36 with the exception that DCTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 39

The manner was all the same as Example 1 with the exception that the silicon wafer was immersed in pure water for 1 min and then in iPA for 1 min after being immersed in hydrofluoric acid aqueous solution for 2 min, followed by being immersed in toluene for 1 min, in "(2) Cleaning of Silicon Wafer". As shown in the evaluation result of Table 2, the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after LTV irradiation was smaller than 0.5 nm, with which it was confirmed that the wafer was not eroded at the time of cleaning and that the residue of the water-repellent cleaning liquid did not remain after UV irradiation.

Example 40

The manner was all the same as Example 15 with the exception that the silicon wafer was immersed in pure water for 1 min and then in iPA for 1 min after being immersed in hydrofluoric acid aqueous solution for 2 min, followed by being immersed in HFE-7100 for 1 min, in "(2) Cleaning of Silicon Wafer". As shown in the evaluation result of Table 2, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 41

The manner was all the same as Example 15 with the exception that the silicon wafer was immersed in pure water for 1 min after being immersed in hydrofluoric acid aqueous solution for 2 min, in "(2) Cleaning of Silicon Wafer". As shown in the evaluation result of Table 2, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 42

The manner was all the same as Example 41 with the exception that CTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 43

The manner was all the same as Example 41 with the exception that DCTFP was used as the organic solvent other than the alcoholic solvent in the water-repellent cleaning liquid. As shown in the evaluation result of Table 2, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 44

The manner was all the same as Example 15 with the exception that ethyldimethylchlorosilane [$C_2H_5Si(CH_3)_2Cl$] was used as the water-repellent compound. As shown in the evaluation result of Table 2, the contact angle after the surface treatment was 78° and therefore the water repellency-providing effect was exhibited. Additionally, the capillary force at the time where water was retained was 0.7 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 45

The manner was all the same as Example 15 with the exception that propyldimethylchlorosilane [$C_3H_7Si(CH_3)_2Cl$] was used as the water-repellent compound. As shown in the evaluation result of Table 2, the contact angle after the surface treatment was 82° and therefore the water repellency-providing effect was exhibited. Additionally, the capillary force at the time where water was retained was 0.5 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Comparative Example 1

The manner was the same as Example 1 with the exception that the water-repellent cleaning liquid was not provided to the silicon wafer. In other words, in this Comparative Example, a wafer which is not under the water repellency-provided surface condition was evaluated. As shown in the evaluation result of Table 2, the contact angle of the wafer was 3°, which is small. Additionally, the capillary force at the time where water was retained was 3.2 MN/m$^2$, which is large.

Comparative Example 2

The manner was the same as Example 1 with the exception that 3.0 g of trimethylchlorosilane and 94.6 g of iPA were mixed, and 2.4 g of 0.1N nitric acid aqueous solution (pH 1) was added thereto, followed by stirring at room temperature for about 24 hours thereby obtaining a water-repellent cleaning liquid. In other words, this Comparative Example used a water-repellent cleaning liquid containing a water-repellent compound in which a reactive moiety was hydrolyzed. As shown in the evaluation result of Table 2, the contact angle of the wafer was 14°, which is small. Additionally, the capillary force at the time where water was retained was 3.1 MN/m$^2$, which is large.

The following Examples 1 to 15 exemplifies a second cleaning agent and the following Comparative Example 1 is opposed to the second cleaning agent. Results of these are shown in Table 3.

Example 1

(1) Preparation of Cleaning Liquid B

First of all, 1.0 g of hexyltrimethoxysilane [$C_6H_{13}Si(OCH_3)_3$] serving as the water-repellent compound and 96.6 g of 2-propanol serving as the alcoholic solvent were mixed, followed by stirring for about 5 minutes. Then, 2.4 g of 0.1N nitric acid aqueous solution (pH 1.0) was added thereto, followed by stirring at room temperature for about 24 hours. By the above-mentioned method, there was obtained a cleaning liquid B having a concentration of the water-repellent compound relative to the total quantity of the cleaning liquid B ((hereinafter referred to as "a water-repellent compound concentration") of 1.0 mass %.

(2) Cleaning of Silicon Wafer

A smooth silicon wafer having a thermal oxide film (a silicon wafer having on its surface a thermal oxide film layer of 1 micrometer thickness) was immersed in 1 mass % hydrofluoric acid aqueous solution for 2 min, and then immersed in pure water for 1 min.

(3) Surface Treatment of Silicon Wafer Surface with Cleaning Liquid B

The cleaning liquid B prepared in the "(1) Preparation of Cleaning Liquid B" was heated to 60° C. The silicon wafer was immersed in this cleaning liquid for 48 hours. Thereafter, the silicon wafer was immersed in pure water for 1 min. Finally, the silicon wafer was drawn out of the pure water, followed by spraying air thereon, thereby removing the water content from the surface.

As a result of evaluating the obtained wafer in a manner discussed in the [Evaluation Method for Silicon Wafer to which Water-Repellent Cleaning Liquid (Cleaning Liquid B) is provided], one which had an initial contact angle of smaller than 10° before a surface treatment changed to have a contact angle of 66° after the surface treatment as shown in Table 3, thereby exhibiting a water repellency-providing effect. Additionally, as a result of calculating the capillary force at the time where water was retained by using the equation discussed in the "Evaluation of Capillary Force", the capillary force was 1.3 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

TABLE 3

| | Cleaning liquid B | | | | | | Treatment after surface treatment with cleaning liquid B | |
|---|---|---|---|---|---|---|---|---|
| | Water-repellent compound | Alcoholic solvent | pH of acidic aqueous solution | Water-repellent compound concentration [mass %] | Immersion Temperature [° C.] | Time [hr] | Drying | Cleaning with solvent |
| Example 1 | $C_6H_{13}Si(OCH_3)_3$ | 2-Propanol | 1.0 | 1.0 | 60 | 48 | Not performed | Not performed |
| Example 2 | $C_6H_{13}Si(OCH_3)_3$ | 2-Propanol | 1.0 | 3.0 | 60 | 48 | Not performed | Not performed |
| Example 3 | $C_6H_{13}Si(OCH_3)_3$ | 2-Propanol | 1.0 | 3.0 | 60 | 96 | Not performed | Not performed |
| Example 4 | $C_{10}H_{21}Si(OCH_3)_3$ | 2-Propanol | 1.0 | 1.0 | 60 | 48 | Not performed | Not performed |
| Example 5 | $C_{18}H_{37}Si(OCH_3)_3$ | 2-Propanol | 1.0 | 1.0 | 60 | 48 | Not performed | Not performed |
| Example 6 | $C_{18}H_{37}Si(OCH_3)_3$ | 2-Propanol | 2.0 | 1.0 | 60 | 48 | Not performed | Not performed |
| Example 7 | $CF_3CH_2CH_2Si(OCH_3)_3$ | 2-Propanol | 1.0 | 1.0 | 60 | 48 | Not performed | Not performed |
| Example 8 | $CF_3(CF_2)_5CH_2CH_2Si(OCH_3)_3$ | 2-Propanol | 1.0 | 1.0 | 60 | 48 | Not performed | Not performed |
| Example 9 | $C_6H_{13}Si(OCH_3)_3$: $CF_3(CF_2)_5CH_2CH_2Si(OCH_3)_3$ = 50:50 | 2-Propanol | 1.0 | 3.0 | 60 | 48 | Not performed | Not performed |
| Example 10 | $C_6H_{13}Si(OCH_3)_3$ | 2-Propanol | 1.0 | 1.0 | 60 | 48 | Not performed | Performed |
| Example 11 | $C_6H_{13}Si(OCH_3)_3$ | 2-Propanol | 1.0 | 1.0 | 60 | 48 | Not performed | Performed |
| Example 12 | $C_6H_{13}Si(OCH_3)_3$ | 2-Propanol | 1.0 | 1.0 | 60 | 48 | Performed | Performed |
| Example 13 | $C_6H_{13}Si(OCH_3)_3$ | 2-Propanol | 1.0 | 1.0 | 60 | 48 | Performed | Performed |
| Example 14 | $C_6H_{13}Si(OCH_3)_3$ | 2-Propanol | 1.0 | 1.0 | 60 | 48 | Performed | Not performed |
| Example 15 | $C_6H_{13}Si(OCH_3)_3$ | 2-Propanol | 1.0 | 1.0 | 60 | 48 | Performed | Not performed |
| Comparative Example 1 | Not treated | — | — | — | — | — | Not performed | Not performed |

| | Treatment after surface treatment with cleaning liquid B | | Evaluation results | | | | | | | | |
|---|---|---|---|---|---|---|---|---|---|---|---|
| | Cleaning with water | Drying | Initial contact angle [°] | Contact angle after surface treatment [°] | | Capillary force [MN/m$^2$] <calculated value> | | Removability of water-repellent surface condition (contact angle [°]) | | Surface smoothness (Ra [nm]) | |
| Example 1 | Performed | Performed | <10 | A | (66) | A | (1.3) | A | (<10) | A | (<0.5) |
| Example 2 | Performed | Performed | <10 | A | (76) | A | (0.8) | A | (<10) | A | (<0.5) |
| Example 3 | Performed | performed | <10 | A | (88) | A | (0.1) | A | (<10) | A | (<0.5) |
| Example 4 | Performed | Performed | <10 | A | (70) | A | (1.1) | A | (<10) | A | (<0.5) |

TABLE 3-continued

| | | | | | | | | | | | |
|---|---|---|---|---|---|---|---|---|---|---|---|
| Example 5 | Performed | Performed | <10 | A | (74) | A | (0.9) | A | (<10) | A | (<0.5) |
| Example 6 | Performed | Performed | <10 | A | (70) | A | (1.1) | A | (<10) | A | (<0.5) |
| Example 7 | Performed | Performed | <10 | A | (68) | A | (1.2) | A | (<10) | A | (<0.5) |
| Example 8 | Performed | Performed | <10 | A | (74) | A | (0.9) | A | (<10) | A | (<0.5) |
| Example 9 | Performed | Performed | <10 | A | (76) | A | (0.8) | A | (<10) | A | (<0.5) |
| Example 10 | Performed | Performed | <10 | A | (66) | A | (1.3) | A | (<10) | A | (<0.5) |
| Example 11 | Not performed | Performed | <10 | A | (66) | A | (1.3) | A | (<10) | A | (<0.5) |
| Example 12 | Performed | Performed | <10 | A | (68) | A | (1.2) | A | (<10) | A | (<0.5) |
| Example 13 | Not performed | Performed | <10 | A | (68) | A | (1.2) | A | (<10) | A | (<0.5) |
| Example 14 | Performed | Performed | <10 | A | (68) | A | (1.2) | A | (<10) | A | (<0.5) |
| Example 15 | Not performed | Not performed | <10 | A | (68) | A | (1.2) | A | (<10) | A | (<0.5) |
| Comparative Example 1 | Performed | Performed | <10 | B | (3) | B | (3.2) | — | | A | (<0.5) |

Example 2

The manner was all the same as Example 1 with the exception that the concentration of hexyltrimethoxysilane was set to 3 mass %. As shown in the evaluation result of Table 3, the contact angle after the surface treatment was 76° and therefore the water repellency-providing effect was exhibited. Additionally, the capillary force at the time where water was retained was 0.8 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 3

The manner was all the same as Example 2 with the exception that the silicon wafer was immersed in the cleaning liquid B for 96 hours. As shown in the evaluation result of Table 3, the contact angle after the surface treatment was 88° and therefore the water repellency-providing effect was exhibited. Additionally, the capillary force at the time where water was retained was 0.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 4

The manner was all the same as Example 1 with the exception that decyltrimethoxysilane [$C_{10}H_{21}Si(OCH_3)_3$] was used as the water-repellent compound. Results and properties are as shown in Table 3, in which the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 5

The manner was all the same as Example 1 with the exception that octadecyltrimethoxysilane [$C_{18}H_{37}Si(OCH_3)_3$] was used as the water-repellent compound. Evaluation result thereof is as shown in Table 3, in which the contact angle after the surface treatment was 74° and therefore the water repellency-providing effect was exhibited. Additionally, the capillary force at the time where water was retained was 0.91 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 6

The manner was all the same as Example 1 with the exception that octadecyltrimethoxysilane [$C_{18}H_{37}Si(OCH_3)_3$] was used as the water-repellent compound and that 1 N acetic acid aqueous solution (pH 2.0) was used as an acidic aqueous solution. Evaluation result thereof is as shown in Table 3, in which the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 7

The manner was all the same as Example 1 with the exception that trifluoropropyltrimethoxysilane [$CF_3CH_2CH_2Si(OCH_3)_3$] was used as the water-repellent compound. Evaluation result thereof is as shown in Table 3, in which the contact angle after the surface treatment was 68° and therefore the water repellency-providing effect was exhibited. Additionally, the capillary force at the time where water was retained was 1.2 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 8

The manner was all the same as Example 1 with the exception that tridecafluorooctyltrimethoxysilane [$C_6F_{13}CH_2CH_2Si(OCH_3)_3$] was used as the water-repellent compound. Evaluation result thereof is as shown in Table 3, in which the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 9

The manner was all the same as Example 1 with the exception that hexyltrimethoxysilane [$C_6H_{13}Si(OCH_3)_3$] and tridecafluorooctyltrimethoxysilane [$C_6F_{13}CH_2CH_2Si(OCH_3)_3$] were used as the water-repellent compound, in a mass ratio of 50:50, and that the water-repellent compound concentration was set to 3 mass %. Evaluation result thereof is as shown in Table 3, in which the contact angle after the surface treatment was 76° and therefore the water repellency-providing effect was exhibited. Additionally, the capillary force at the time where water was retained was 0.8 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 10

The manner was all the same as Example 1 with the exception that, in "(3) Surface Treatment of Silicon Wafer Surface with Cleaning Liquid B", the silicon wafer was immersed in 2-propanol for 1 min and then in pure water for 1 min after being immersed in the cleaning liquid B, followed by spraying air on the silicon wafer finally drawn out of the pure water to remove the water content from the surface to obtain a wafer of which surface was treated. Evaluation result thereof is as shown in Table 3, in which the contact angle after the surface treatment was 66° and therefore the water repellency-providing effect was exhibited. Additionally, the capillary force at the time where water was retained was 1.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 11

The manner was all the same as Example 1 with the exception that, in "(3) Surface Treatment of Silicon Wafer Surface with Cleaning Liquid B", the silicon wafer was immersed in 2-propanol for 1 min after being immersed in the cleaning liquid B, followed by spraying air on the silicon wafer finally drawn out of 2-propanol to remove 2-propanol from the surface to obtain a wafer of which surface was treated. Evaluation result thereof is as shown in Table 3, in which the contact angle after the surface treatment was 66° and therefore the water repellency-providing effect was exhibited. Additionally, the capillary force at the time where water was retained was 1.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 12

The manner was all the same as Example 1 with the exception that, in "(3) Surface Treatment of Silicon Wafer Surface with Cleaning Liquid B", the silicon wafer was drawn out of the cleaning liquid B, followed by spraying air thereon to remove the cleaning liquid B from the surface and that the silicon wafer was immersed in 2-propanol for 1 min and then in pure water for 1 min and was finally drawn out of the pure water, followed by spraying air thereon to remove the water content from the surface to obtain a wafer of which surface was treated. Evaluation result thereof is as shown in Table 3, in which the contact angle after the surface treatment was 68° and therefore the water repellency-providing effect was exhibited. Additionally, the capillary force at the time where water was retained was 1.2 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 13

The manner was all the same as Example 1 with the exception that, in "(3) Surface Treatment of Silicon Wafer Surface with Cleaning Liquid B", the silicon wafer was drawn out of the cleaning liquid B, followed by spraying air thereon to remove the cleaning liquid B from the surface and that the silicon wafer was immersed in 2-propanol for 1 min and finally drawn out of 2-propanol, followed by spraying air thereon to remove 2-propanol from the surface to obtain a wafer of which surface was treated. Evaluation result thereof is as shown in Table 3, in which the contact angle after the surface treatment was 68 and therefore the water repellency-providing effect was exhibited. Additionally, the capillary force at the time where water was retained was 1.2 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 14

The manner was all the same as Example 1 with the exception that, in "(3) Surface Treatment of Silicon Wafer Surface with Cleaning Liquid B", the silicon wafer was drawn out of the cleaning liquid B, followed by spraying air thereon to remove the cleaning liquid B from the surface and that the silicon wafer was immersed in pure water for 1 min and finally drawn out of pure water, followed by spraying air thereon to remove the water content from the surface to obtain a wafer of which surface was treated. Evaluation result thereof is as shown in Table 3, in which the contact angle after the surface treatment was 68° and therefore the water repellency-providing effect was exhibited. Additionally, the capillary force at the time where water was retained was 1.2 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Example 15

The manner was all the same as Example 1 with the exception that, in "(3) Surface Treatment of Silicon Wafer Surface with Cleaning Liquid B", the silicon wafer was drawn out of the cleaning liquid B, followed by spraying air thereon to remove the cleaning liquid B from the surface to obtain a wafer of which surface was treated. Evaluation result thereof is as shown in Table 3, in which the contact angle after the surface treatment was 68° and therefore the water repellency-providing effect was exhibited. Additionally, the capillary force at the time where water was retained was 1.2 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the cleaning liquid B did not remain after UV irradiation.

Comparative Example 1

The manner was the same as Example 1 with the exception that the cleaning liquid B was not provided to the silicon wafer. In other words, in this Comparative Example, a silicon wafer which is not under the water repellency-provided surface condition was evaluated. Evaluation result thereof is as shown in Table 3, in which the contact angle of the wafer was 3°, which is small. Additionally, the capillary force at the time where water was retained was 3.2 MN/m², so that the capillary force was large.

EXPLANATION OF REFERENCE NUMERALS

1 Silicon wafer
2 Finely uneven pattern that the silicon wafer has at its surface
3 Projected portions of the pattern
4 Recessed portions of the pattern
5 Width of the recessed portions
6 Height of the projected portions
7 Width of the projected portions
8 Cleaning liquid retained in the recessed portions 4
9 Water-based cleaning liquid retained in the recessed portions 4
10 Surface condition provided with water repellency by a water-repellent compound.

The invention claimed is:

1. A cleaning agent for a silicon wafer having a finely uneven pattern at its surface, comprising:
a water-based cleaning liquid selected from the group consisting of water, and a mixture of 50 mass % or more water and at least one kind of an organic solvent, acid, and alkali; and
a water-repellent cleaning liquid for providing at least a recessed portion of the uneven pattern with water repellency during a cleaning process, the water-repellent cleaning liquid comprising a mixture of a water-repellent compound and an organic solvent, the water-repellent compound having a hydrophobic group and a reactive moiety chemically bondable to Si element in the silicon wafer, the organic solvent containing at least an alcoholic solvent,
wherein the water-repellent compound comprises at least one selected from the group consisting of the following general formulas [1] and [2]

$$(R^1)_a Si(CH_3)_b H_c X_{4-a-b-c} \quad [1]$$

$$[R^2 Si(CH_3)_{2-d} H_d]_e NH_{3-e} \quad [2]$$

where: $R^1$ mutually independently represents one of a monovalent organic group having hydrocarbon group with a carbon number of from 1 to 18 and a monovalent organic group having fluoroalkyl chain with a carbon number of from 1 to 8; $R^2$ mutually independently represents one of a monovalent organic group having hydrocarbon group with a carbon number of from 1 to 18 and a monovalent organic group having fluoroalkyl chain with a carbon number of from 1 to 8; X mutually independently represents at least one group selected from the group consisting of halogen group, alkoxy group, acetoxy group, trifluoroacetoxy group, —OC(CH₃)═CHCOCH₃, —OC(CH₃)═N—Si(CH₃)₃, —OC(CF₃)═N—Si(CH₃)₃, —CO—NH—Si(CH₃)₃, alkylsulfonate group, perfluoroalkylsulfonate group, nitrile group and a monovalent organic group whose element to be bonded to Si element is nitrogen; a is an integer of from 1 to 3; each of b and c is an integer of from 0 to 2; the total of a, b and c is from 1 to 3; d is an integer of from 0 to 2; e is an integer of from 1 to 3.

2. A cleaning agent for a silicon wafer, as claimed in claim 1, wherein the alcoholic solvent is at least one selected from the group consisting of alcohols with a carbon number of not greater than 10.

3. A cleaning agent for a silicon wafer, as claimed in claim 1, wherein the organic solvent comprises the alcoholic solvent and an aprotic solvent.

4. A cleaning agent for a silicon wafer, as claimed in claim 1, wherein the organic solvent comprises the alcoholic solvent and a halogen element-containing uninflammable solvent.

5. A cleaning agent for a silicon wafer, as claimed in claim 1, wherein a surface of the recessed portion of the silicon wafer which surface is provided with water repellency by the water-repellent cleaning liquid has a capillary force of not larger than 2.1 MN/m² on the assumption that water is retained in the recessed portion of the surface of the silicon wafer.

6. A water-repellent cleaning liquid for providing water repellency, during a cleaning process for a silicon wafer having at its surface a finely uneven pattern, at least to a recessed portion of the uneven pattern, comprising:
   a water-repellent compound having a reactive moiety chemically bondable to Si element in the silicon wafer, and a hydrophobic group; and
   an organic solvent containing at least an alcoholic solvent and mixed with the water-repellent compound,
   wherein the water-repellent compound and the organic solvent are mixed,
   wherein the water-repellent compound comprises at least one selected from the group consisting of the following general formulas [1] and [2]

$$(R^1)_a Si(CH_3)_b H_c X_{4-a-b-c} \quad [1]$$

$$[R^2 Si(CH_3)_{2-d} H_d]_e NH_{3-e} \quad [2]$$

where: $R^1$ mutually independently represents one of a monovalent organic group having hydrocarbon group with a carbon number of from 1 to 18 and a monovalent organic group having fluoroalkyl chain with a carbon number of from 1 to 8; $R^2$ mutually independently represents one of a monovalent organic group having hydrocarbon group with a carbon number of from 1 to 18 and a monovalent organic group having fluoroalkyl chain with a carbon number of from 1 to 8; X mutually independently represents at least one group selected from the group consisting of halogen group, alkoxy group, acetoxy group, trifluoroacetoxy group, —OC(CH$_3$)=CHCOCH$_3$, —OC(CH$_3$)=N—Si(CH$_3$)$_3$, —OC(CF$_3$)=N—Si(CH$_3$)$_3$, —CO—NH—Si(CH$_3$)$_3$, alkylsulfonate group, perfluoroalkylsulfonate group, nitrile group and a monovalent organic group whose element to be bonded to Si element is nitrogen; a is an integer of from 1 to 3; each of b and c is an integer of from 0 to 2; the total of a, b and c is from 1 to 3; d is an integer of from 0 to 2; e is an integer of from 1 to 3, and wherein the water-repellent cleaning liquid is part of a cleaning solution that also includes a water-based cleaning liquid selected from the group consisting of water, and a mixture of 50 mass % or more water and at least one kind of an organic solvent, acid, and alkali.

* * * * *